(12) United States Patent
Matsushita

(10) Patent No.: US 11,778,797 B2
(45) Date of Patent: Oct. 3, 2023

(54) COMPONENT REPLENISHMENT MANAGEMENT SYSTEM AND COMPONENT MOUNTING SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 596 days.

(21) Appl. No.: 17/049,319

(22) PCT Filed: May 30, 2018

(86) PCT No.: PCT/JP2018/020790
§ 371 (c)(1),
(2) Date: Oct. 20, 2020

(87) PCT Pub. No.: WO2019/229881
PCT Pub. Date: Dec. 5, 2019

(65) Prior Publication Data
US 2021/0059086 A1    Feb. 25, 2021

(51) Int. Cl.
*H05K 13/02* (2006.01)
*G06Q 10/0631* (2023.01)
(Continued)

(52) U.S. Cl.
CPC ....... *H05K 13/02* (2013.01); *G06Q 10/06312* (2013.01); *G06Q 10/06315* (2013.01);
(Continued)

(58) Field of Classification Search
CPC .......... Y10T 29/53174; Y10T 29/5137; Y10T 29/53004; G05B 19/41865;
(Continued)

(56) References Cited

U.S. PATENT DOCUMENTS 9,801,318 B2 * 10/2017 Sumi ................. H05K 13/0417
10,620,614 B2 * 4/2020 Nakazono ........ G05B 19/41865
(Continued)

FOREIGN PATENT DOCUMENTS

CN    1189436 A    8/1998
CN    1705434 A    12/2005
(Continued)

OTHER PUBLICATIONS

International Search Report issued in PCT/JP2018/020790; dated Aug. 14, 2018.

*Primary Examiner* — Thiem D Phan
(74) *Attorney, Agent, or Firm* — Studebaker & Brackett PC

(57) ABSTRACT

In a component replenishment management system, a component supply monitoring unit estimates replenishable time, which represents time until component replenishment work becomes possible, for each of component supply devices. A work determination unit determines whether or not the component replenishment work can be actually performed at a timing at which replenishment component type information is acquired by an external input and output unit. In a case where the work determination unit determines that the component replenishment work cannot be performed, a work guidance unit generates performing process guidance information. The performing process guidance information is information for guiding a performing process based on the replenishable time of the component replenishment work.

10 Claims, 20 Drawing Sheets

(51) Int. Cl.
  *G06Q 10/087* (2023.01)
  *G06Q 50/04* (2012.01)
  *G07C 1/20* (2006.01)

(52) U.S. Cl.
  CPC ..... *G06Q 10/06316* (2013.01); *G06Q 10/087* (2013.01); *G06Q 50/04* (2013.01); *G07C 1/20* (2013.01); *Y10T 29/53004* (2015.01)

(58) Field of Classification Search
  CPC ...... G05B 2219/36195; G05B 19/4155; G05B 2219/31027; H01F 41/041; H05K 13/02
  USPC ...... 29/701, 428, 592.1, 703, 739, 740, 760, 29/791, 860
  See application file for complete search history.

(56) References Cited

U.S. PATENT DOCUMENTS

| | | |
|---|---|---|
| 2005/0125998 A1 | 6/2005 | Mimura et al. |
| 2015/0212519 A1 | 7/2015 | Sumi |
| 2016/0278252 A1 | 9/2016 | Kato |
| 2017/0308832 A1 | 10/2017 | Takehara et al. |
| 2018/0116079 A1 | 4/2018 | Horaguchi et al. |

FOREIGN PATENT DOCUMENTS

| | | |
|---|---|---|
| CN | 101400249 A | 4/2009 |
| CN | 102014604 A | 4/2011 |
| CN | 103582410 A | 2/2014 |
| CN | 104429174 A | 3/2015 |
| CN | 104996006 A | 10/2015 |
| CN | 107318257 A | 11/2017 |
| CN | 107535083 A | 1/2018 |
| EP | 2874481 A1 | 5/2015 |
| EP | 2958413 A1 | 12/2015 |
| JP | H09-331197 A | 12/1997 |
| JP | 2004-021281 A | 1/2004 |
| JP | 2004-134691 A | 4/2004 |
| JP | 2012-028660 A | 2/2012 |
| JP | 2012-142519 A | 7/2012 |
| JP | 2015-130403 A | 7/2015 |
| JP | 2016-143784 A | 8/2016 |
| JP | 2016-225387 A | 12/2016 |
| WO | 03/067951 A1 | 8/2003 |
| WO | 2015/079488 A1 | 6/2015 |

\* cited by examiner

FIG.8

| MOUNTER TYPE | COMPONENT SUPPLY DEVICE | | COMPONENT TYPE | PRECEDING COMPONENT REMAINING NUMBER | TOTAL COMPONENT REMAINING NUMBER | COMPONENT REMAINING NUMBER WARNING VALUE | COMPONENT REMAINING NUMBER STOP VALUE |
|---|---|---|---|---|---|---|---|
| | SET POSITION | DEVICE TYPE | | | | | |
| M1 | S11 | F1 | P11 | NA1 | NA11 | NW11 | NS11 |
| | S12 | F1 | P12 | NA2 | NA12 | NW12 | NS12 |
| | S13 | F1 | P13 | NA3 | NA13 | NW13 | NS13 |
| | ... | ... | ... | ... | ... | ... | ... |

J11 / J12 / J13 / J14 / J15 / J16 / J17 / J18

ATTACHMENT INFORMATION JH1

FIG.10

PRODUCTION PLAN INFORMATION JH2

| PRODUCTION ORDER (J21) | SUBSTRATE TYPE (J22) | PRODUCTION QUANTITY (J23) | CYCLE TIME (SECOND/SHEET) (J24) |
|---|---|---|---|
| 1 | SUBSTRATE A | AA | CTA |
| 2 | SUBSTRATE B | BB | CTB |
| ... | ... | ... | ... |

| SUBSTRATE TYPE (J22) | SET POSITION (J12) | COMPONENT TYPE (J14) | COMPONENT REQUIRED NUMBER (NUMBER/SHEET) (J31) |
|---|---|---|---|
| SUBSTRATE A | S11 | P11 | N11 |
|  | S12 | P12 | N12 |
|  | S13 | P13 | N13 |
|  | ... | ... | ... |

FIG.13

| | | COMPONENT SUPPLY DEVICE | | | | | | | | |
|---|---|---|---|---|---|---|---|---|---|---|
| WORK TARGET AREA NUMBER | MOUNTER TYPE | SET POSITION | DEVICE TYPE | COMPONENT TYPE | TOTAL COMPONENT REMAINING NUMBER | COMPONENT REQUIRED NUMBER (NUMBER/SHEET) | REPLENISHABLE TIME TT | WARNING TIME WT | STOP TIME ST | PRODUCIBLE TIME PT |
| J41 | J11 | J12 | J13 | J14 | J16 | J31 | J42 | J43 | J44 | J45 |
| WA1 | M1 | S11 | AF | P11 | NA11 | N11 | TT11 | WT11 | ST11 | PT11 |
| WA1 | M1 | S12 | AF | P12 | NA12 | N12 | TT12 | WT12 | ST12 | PT12 |
| WA1 | M1 | S13 | AF | P13 | NA13 | N13 | TT13 | WT13 | ST13 | PT13 |
| ... | ... | ... | ... | ... | ... | ... | ... | ... | ... | ... |

WORK LIST INFORMATION JH4

FIG.19A

SUSPENSION LIST INFORMATION JH6

| WORK TARGET AREA NUMBER | MOUNTER TYPE | COMPONENT SUPPLY DEVICE | | COMPONENT TYPE | FLAG |
|---|---|---|---|---|---|
| | | SET POSITION | DEVICE TYPE | | |
| WA1 | M1 | S13 | AF | P13 | SUSPENDED |

SUSPENSION LIST INFORMATION JH6

| WORK TARGET AREA NUMBER | MOUNTER TYPE | COMPONENT SUPPLY DEVICE | | COMPONENT TYPE | FLAG |
|---|---|---|---|---|---|
| | | SET POSITION | DEVICE TYPE | | |
| WA1 | M1 | S13 | AF | P13 | WORKABLE |

J41, J11, J12, J13, J14, J61

COMPONENT REPLENISHMENT MANAGEMENT SYSTEM AND COMPONENT MOUNTING SYSTEM

CROSS-REFERENCE TO RELATED APPLICATION

This application is a National Stage of International Patent Application No. PCT/JP2018/020790, filed May 30, 2018, the entire content of which is incorporated herein by reference.

BACKGROUND

Technical Field

The present disclosure relates to a component replenishment management system that manages component replenishment work for each of a plurality of component supply devices attached to each component mounter on a component mounting line, and a component mounting system including the component replenishment management system.

Background Art

A component mounting line for producing a component mounting substrate in which an electronic component (hereinafter simply referred to as the "component") is mounted on a substrate such as a printed wiring substrate is configured by connecting a plurality of component mounters that mount the component on a substrate. A plurality of component supply devices that can mount a component storage member are provided in parallel in each component mounter. When a component mounting substrate is produced by each component mounter in the component mounting line, an operator performs setup work such as mounting a component storage member required for production in a component supply device based on a production plan of the component mounting substrate, and then production is started. During the production of the component mounting substrate, an operator performs component replenishment work for replenishing the component supply device with the component storage member according to consumption of the component accompanying the production of the component mounting substrate in order to prevent the supply of the component from the component supply device from being stopped and the production of the component mounting substrate from being stopped.

For example, Japanese Patent Laid-Open No. 2012-28660 discloses a technique for achieving improvement in the efficiency of the component replenishment work by an operator. In the technique disclosed in Japanese Patent Laid-Open No. 2012-28660, in a component mounting line in which a plurality of component mounters are disposed, processing of predicting a time zone for preannouncing running out of the component in a plurality of component supply devices (feeders) attached to each of the component mounters is executed, and processing for allocating an operator who performs the component replenishment work is executed in the component running out preannouncement time zone.

A replenishment timing with the component storage member for each component supply device is merely prediction, and there is a case where, when an operator actually attempts to perform the component replenishment work, the component replenishment work for the component supply device targeted for the work cannot be performed. In such a case, the operator is confused because the operator does not know how to deal with the situation. For this reason, the work efficiency of the component replenishment work by the operator may be lowered.

SUMMARY

The present disclosure has been made in view of such circumstances, and thus provides a component replenishment management system capable of improving efficiency of component replenishment work for a component supply device attached to each component mounter in a component mounting line, and a component mounting system including the component replenishment management system.

A component replenishment management system according to one aspect of the present disclosure is a system that manages, in one or a plurality of component mounting lines in which a plurality of component mounters are connected, the component mounters being for mounting a component supplied from a plurality of component supply devices capable of mounting a plurality of component storage members on a substrate to produce a component mounting substrate, component replenishment work for each of the plurality of component supply devices. The component replenishment work is performed by an operator who makes the patrols in a work area set to the component mounting lines. The component replenishment management system includes a component supply monitoring unit configured to monitor a supply state of a component in each of the plurality of component supply devices, and estimate, for each of the plurality of component supply devices, replenishable time representing time until a preceding component storage member from which component supply is performed first among the plurality of component storage members runs out of a component and the component replenishment work for replenishing with a new component storage member for replenishment becomes possible. The component replenishment management system further includes an information acquisition unit configured to acquire replenishment component type information for identifying a component type of a component stored in the component storage member for replenishment, a determination unit configured to determine whether or not the component replenishment work for replenishing the component supply device with the component storage member for replenishment is allowed to be performed at a timing at which the replenishment component type information is acquired by the information acquisition unit, and a work guidance unit configured to generate performing process guidance information guiding a performing process based on the replenishable time of the component replenishment work in a case where the determination unit determines that the component replenishment work is not allowed to be performed.

A component mounting system according to another aspect of the present disclosure includes one or a plurality of component mounting lines in which a plurality of component mounters are connected, the component mounters being for mounting a component supplied from a plurality of component supply devices capable of mounting a plurality of component storage members on a substrate to produce a component mounting substrate, and the component replenishment management system that manages component replenishment work for each of the plurality of component supply devices. The component replenishment work is performed by an operator who makes the patrols in a work area set to the component mounting lines.

The object, feature, and advantage of the present disclosure will become more clear by detailed description below and the accompanying drawings.

BRIEF DESCRIPTION OF THE DRAWINGS

FIG. 8 is a diagram for describing attachment information stored in a memory unit of a mounting control device constituting a component replenishment management system.

FIG. 10 is a diagram for describing production plan information input to the replenishment plan management device.

FIG. 13 is a diagram for describing work list information generated by the component supply monitoring unit and the replenishment management unit.

FIGS. 19A and 19B are diagrams for describing suspension list information generated by the work guidance unit.

DETAILED DESCRIPTION

Hereinafter, a component replenishment management system and a component mounting system according to an embodiment of the present disclosure will be described with reference to the drawings.

[Overall Configuration of Component Mounting System]

Figure 1:
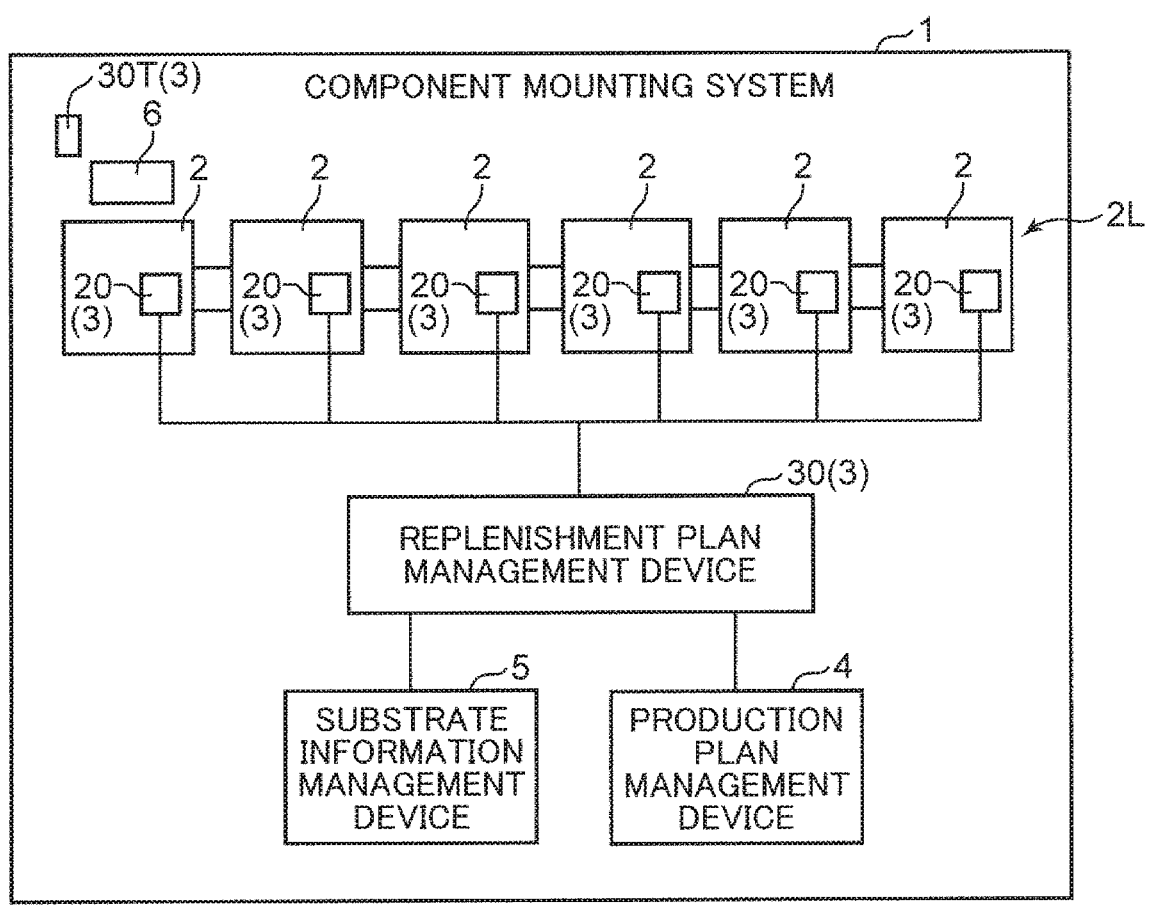
FIG. 1 is a diagram schematically showing a configuration of a component mounting system according to an embodiment of the present disclosure.

FIG. 1 is a diagram schematically showing a configuration of a component mounting system 1 according to an embodiment of the present disclosure. The component mounting system 1 includes a component mounting line 2L, a component replenishment management system 3, a production plan management device 4, a substrate information management device 5, and a cart 6 operated by an operator. The component replenishment management system 3 includes a mounting control device 20 provided in each component mounter 2 that constitutes the component mounting line 2L, a replenishment plan management device 30, and a mobile terminal device 30T carried by an operator. In the component mounting system 1, the replenishment plan management device 30 and the mobile terminal device 30T are connected to each of the mounting control devices 20 in a data communicable manner, and the production plan management device 4 and the substrate information management device 5 are connected to the replenishment plan management device 30 in a data communicable manner.

The component mounting line 2L is configured by a plurality of component mounters 2 connected to each other. In the component mounting line 2L, each of the plurality of component mounters 2 is connected in a manner arranged in a straight line by a connecting conveyor that conveys a substrate between the component mounters 2. In the example shown in FIG. 1, six component mounters 2 are connected in the component mounting line 2L. Note that, although FIG. 1 shows only one component mounting line 2L, the component mounting system 1 may have a configuration including a plurality of component mounting lines 2L.

<Configuration of Component Mounter>

Figure 2:
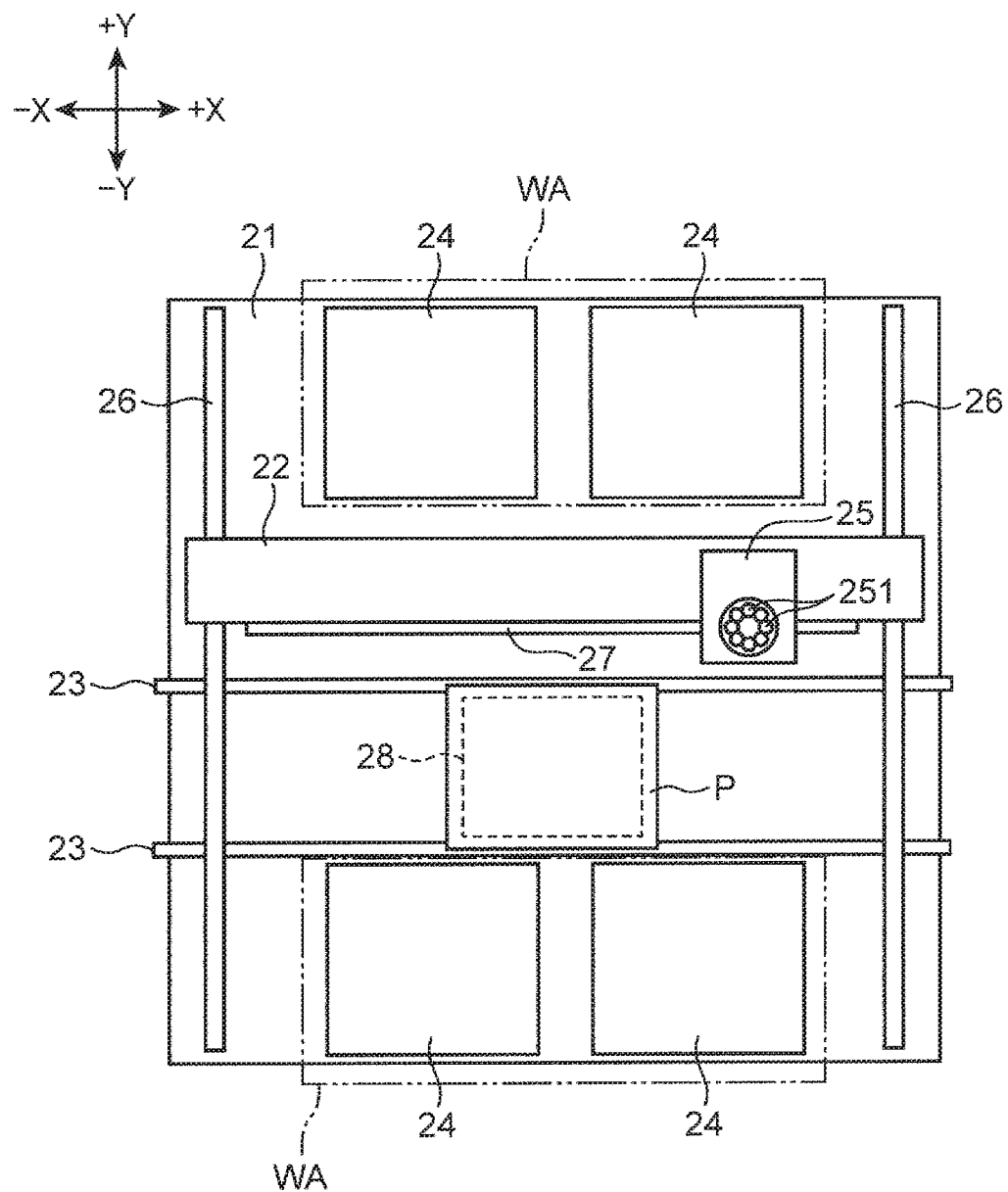
FIG. 2 is a plan view showing a configuration of a component mounter.

First, a configuration of the component mounter 2 will be described with reference to FIG. 2. FIG. 2 is a plan view showing the configuration of the component mounter 2. Note that, hereinafter, the directional relationship will be described using XY orthogonal coordinate axes. One direction side in the X-axis direction is referred to as "+X side", and the other direction side opposite to the one direction side in the X-axis direction is referred to as "−X side". Further, one direction side in the Y-axis direction is referred to as "+Y side", and the other direction side opposite to the one direction side in the Y-axis direction is referred to as "−Y side".

The component mounter 2 is a device that mounts the component on the substrate P to produce a component mounting substrate. The component mounter 2 includes a main body frame 21, a moving frame 22, a conveyor 23, a component supply unit 24, a head unit 25, a first drive mechanism 26, a second drive mechanism 27, and a substrate support device 28.

The main body frame 21 is a structure in which each unit constituting the component mounter 2 is disposed, and is formed in a substantially rectangular shape in a plan view when viewed in a direction orthogonal to both the X-axis direction and the Y-axis direction. The conveyor 23 extends in the X-axis direction and is disposed on the main body frame 21. The conveyor 23 conveys the substrate P in the X-axis direction. The substrate P conveyed on the conveyor 23 is positioned by a substrate support device 28 at a predetermined work position (a component mounting position where the component is mounted on the substrate P). The substrate support device 28 positions the substrate P by supporting the substrate P with a backup pin.

The component supply units 24 are disposed in a total of four locations, two locations in the X-axis direction in each of +Y side and −Y side regions in the Y-axis direction of the main body frame 21. The component supply unit 24 supplies the component mounted on the substrate P, and has a plurality of component supply devices provided in parallel. The component supply device disposed in the component supply unit 24 will be described later.

The moving frame 22 extends in the X-axis direction and is supported by the main body frame 21 so as to be movable in a predetermined moving direction (Y-axis direction). The head unit 25 is mounted on the moving frame 22. The head unit 25 is mounted on the moving frame 22 so as to be movable in the X-axis direction. That is, the head unit 25 is movable in the Y-axis direction along with the movement of the moving frame 22, and is also movable in the X-axis direction along the moving frame 22. The head unit 25 is movable between the component supply unit 24 and a predetermined working position of the substrate P conveyed by the conveyor 23, and takes out the component from the component supply unit 24 and mounts the taken-out component on the substrate P. The head unit 25 includes an adsorption nozzle 251. The adsorption nozzle 251 is a holder capable of sucking and holding the component supplied by the component supply unit 24. The adsorption nozzle 251 can communicate with any of a negative pressure generation device, a positive pressure generation device, and the atmosphere via an electric switching valve. That is, adsorption and holding of the component (taking out of the component) by the adsorption nozzle 251 becomes possible as a negative pressure is supplied to the adsorption nozzle 251, and thereafter, the adsorption and holding of the component is released as a positive pressure is supplied.

The first drive mechanism 26 is disposed in end portions on the +X side and −X side of the main body frame 21. The first drive mechanism 26 is a mechanism that moves the moving frame 22 in the Y-axis direction. The first drive mechanism 26 is configured to include, for example, a drive motor, a ball screw shaft that extends in the Y-axis direction and is connected to the drive motor, and a ball nut that is provided on the moving frame 22 and screwed with the ball screw shaft. The first drive mechanism 26 having such a configuration moves the moving frame 22 in the Y-axis direction by the ball nut moving forward and backward along the ball screw shaft as the ball screw shaft is rotationally driven by the drive motor.

The second drive mechanism 27 is provided on the moving frame 22. The second drive mechanism 27 is a mechanism that moves the head unit 25 in the X-axis direction along the moving frame 22. Similar to the first drive mechanism 26, the second drive mechanism 27 includes, for example, a drive motor, a ball screw shaft that extends in the X-axis direction and is connected to the drive motor, and a ball nut that is provided on the head unit 25 and screwed with the ball screw shaft. The second drive mechanism 27 having such a configuration moves the head unit 25 in the X-axis direction by the ball nut moving forward and backward along the ball screw shaft as the ball screw shaft is rotationally driven by the drive motor.

<Regarding Component Supply Device>

The component supply devices provided in parallel in the component supply unit 24 are roughly classified into a tape feeder, a tray feeder, and a stick feeder according to a difference in a component supply system. In each of the component supply units 24 of the component mounter 2, one type of component supply devices having the same component supply system may be disposed, or two or more types of component supply devices having different component supply systems may be disposed.

(Tape Feeder)

First, a tape feeder serving as the component supply device is configured such that a component storage tape containing the components at predetermined intervals is wound around a reel serving as a component storage member, and the component storage tape is sent out from the reel. The tape feeders are roughly classified into a splicing feeder and an automatic loading feeder (AF). The splicing feeder is configured so that one reel is mounted. Before sending out of the component storage tape from the reel is completed and the component runs out, transition is made from the component storage tape to a subsequent component storage tape. For this purpose, an end portion of the preceding component storage tape and a front portion of the subsequent component storage tape are attached with a splicing tape or the like so as to be connected to each other. That is, in the splicing feeder, the splicing work of attaching with a splicing tape or the like is performed before sending out of the component storage tape from one reel is completed and the component runs out. Accordingly, a replenishment timing with a reel wound with the subsequent component storage tape is restricted to a time point at which sending out of the preceding component storage tape is completed.

On the other hand, the AF is configured so that a plurality of reels can be mounted. Upon completion of sending out of a component storage tape from a preceding reel wound with a component storage tape (hereinafter referred to as a "preceding component storage tape") by which the component is supplied first among the plurality of reels, a component storage tape is sent out from a subsequent reel wound with a subsequent component storage tape automatically without the need of splicing work if there is a subsequent component storage tape that has already been inserted in the AF. That is, in the AF, the replenishment timing with a new reel is not restricted to a time point at which sending out of a component storage tape from a preceding reel wound with the preceding component storage tape is completed, and the component replenishment work can be performed at any time as long as a subsequent component storage tape can be inserted in the AF. Accordingly, there is more degree of freedom as compared with the splicing feeder.

Figure 3:
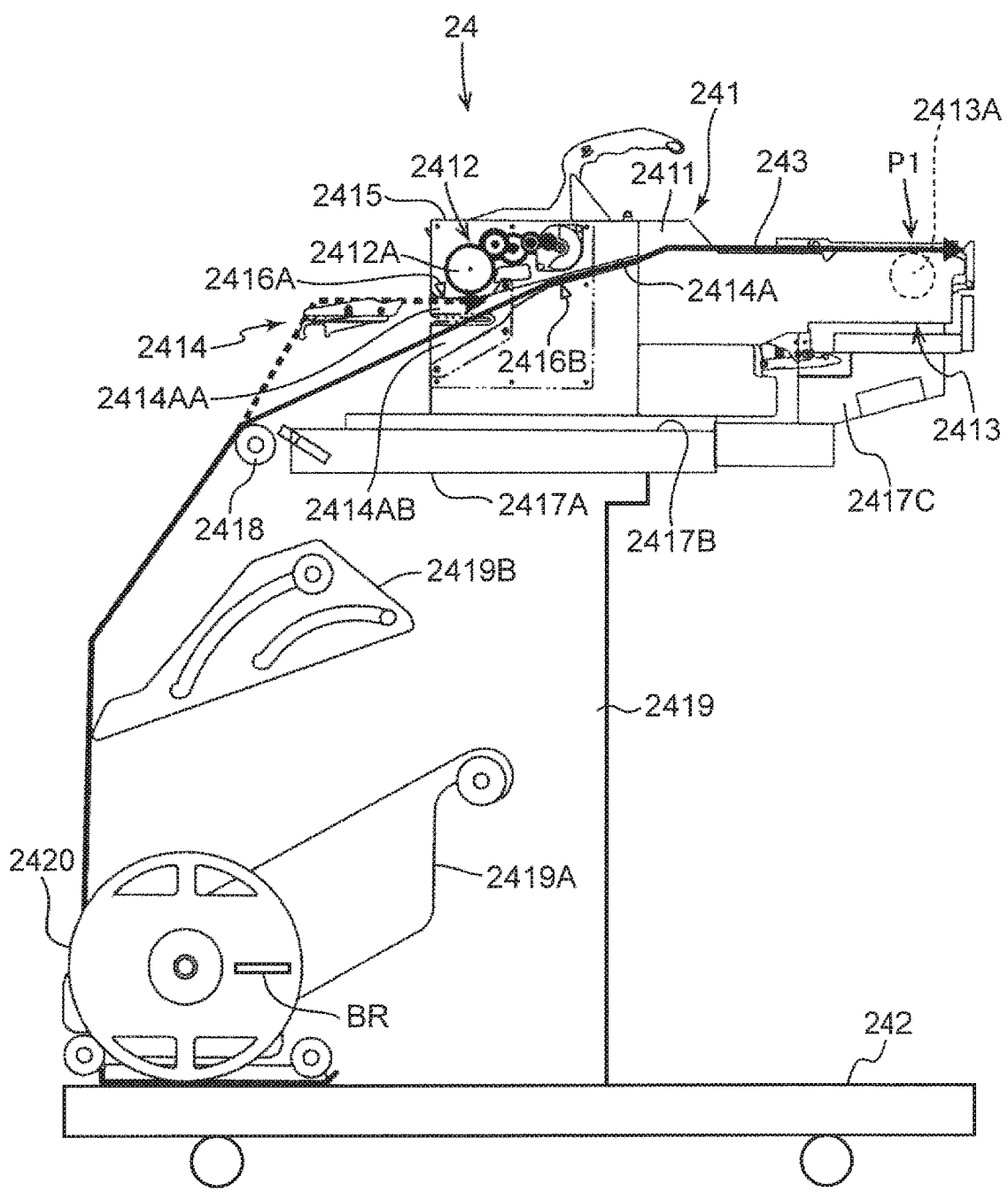
FIG. 3 is a diagram schematically showing a tape feeder as a component supply device disposed in a component supply unit of the component mounter.
Figure 4:
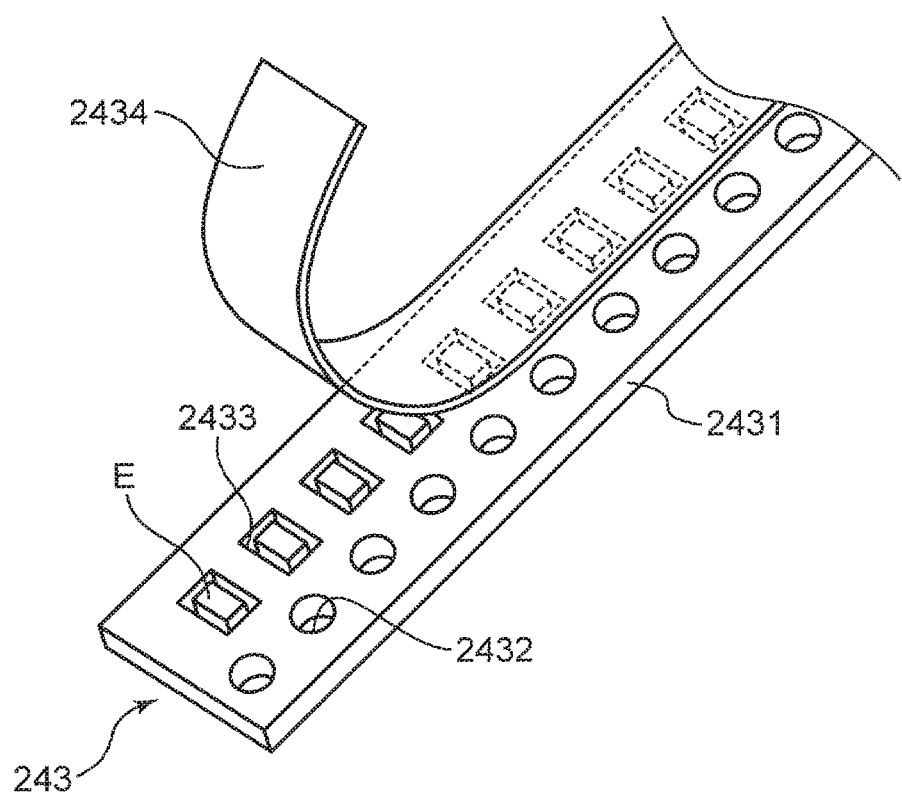
FIG. 4 is a perspective view showing a component storage tape mounted on the tape feeder.

The tape feeder disposed in the component supply unit 24 may be a mixture of the splicing feeder and the AF. In the present embodiment, a plurality of AFs capable of being mounted with a plurality of reels as the component storage member are disposed as the component supply device. The tape feeder including the AF as the component supply device will be described with reference to FIGS. 3 and 4. FIG. 3 is a diagram schematically showing a configuration of an AF 241, and FIG. 4 is a perspective view showing a component storage tape 243 mounted on the AF 241.

In the component supply unit 24, the AF 241 is disposed on a carriage 242. The AF 241 can be mounted with a plurality of reels 2420 around which the component storage tape 243 is wound.

Prior to description of the configuration of the AF 241, the component storage tape 243 will be described with reference to FIG. 4. The component storage tape 243 includes a carrier tape 2431 and a cover tape 2434. The carrier tape 2431 is a tape on which a plurality of component storage portions 2433 for storing a component E are arranged at predetermined intervals. Further, the carrier tape 2431 has, in one end portion in the width direction of the carrier tape 2431, conveying force transmission holes 2432, which are arranged at predetermined intervals and fitted to tooth portions of a first sprocket 2412A and a second sprocket 2413A in the AF 241 described later, and to which a conveying force for sending out the component storage tape 243 is transmitted by the first sprocket 2412A and the second sprocket 2413A. The cover tape 2434 is a tape attached to the carrier tape 2431 so as to cover the component storage portion 2433.

As shown in FIG. 3, the AF 241 is attached to a feeder attachment unit 2417A provided in the component supply unit 24. Specifically, the component supply unit 24 is provided with the feeder attachment unit 2417A and a reel support unit 2419. The feeder attachment unit 2417A is provided with a plurality of slots 2417B arranged at regular intervals in the X-axis direction and extending parallel to each other in the Y-axis direction, and a fixed base 2417C extending in the X-axis direction at a position in front of these slots 2417B. Then, the AF 241 is set in each of the slots 2417B, and each of the AFs 241 is fixed to the fixed base 2417C. In this manner, the plurality of AFs 241 are provided side by side on the carriage 242 in the component supply unit 24.

The reel support unit 2419 is positioned on the lower rear side of the feeder attachment unit 2417A, and supports a first reel holder 2419A and a second reel holder 2419B that rotatably support the reel 2420 in a state where they are vertically separated from each other. The component storage tape 243 is wound around the reel 2420 supported by each of the first reel holder 2419A and the second reel holder 2419B.

The AF 241 includes a feeder main body 2411. The AF 241 is fixed to the fixed base 2417C with the feeder main body 2411 inserted (set) in the slot 2417B. The feeder main body 2411 rotatably supports the first sprocket 2412A constituting a first tape feeding unit 2412 and the second sprocket 2413A constituting a second tape feeding unit 2413 which is separated in the Y-axis direction away from the reel support unit 2419 with respect to the first sprocket 2412A. The first sprocket 2412A and the second sprocket 2413A each includes a plurality of tooth portions arranged at predetermined intervals in the circumferential direction. The tooth portions of the first sprocket 2412A and the second sprocket 2413A can be fitted to the conveying force transmission holes 2432 formed on the carrier tape 2431 of the component storage tape 243.

The component storage tape 243 wound around the reel 2420 supported by each of the first reel holder 2419A and the second reel holder 2419B is guided to the first sprocket 2412A and the second sprocket 2413A while being guided by a guide roller 2418 provided at an upper end of the reel support unit 2419. The component storage tape 243 having the conveying force transmission hole 2432 fitted to the tooth portions of the first sprocket 2412A and the second sprocket 2413A is sent out by the rotation of the first sprocket 2412A and the second sprocket 2413A, and component E is taken out at a component supply position P1.

The AF 241 further includes a tape support member 2414 detachably fixed to a rear end portion of the feeder main body 2411, an operation input unit 2415 disposed on an upper rear surface of the feeder main body 2411, and first and second tape detection sensors 2416A and 2416B.

As shown in FIG. 3, the tape support member 2414 divides a rear end portion of a tape travelling path 2414A on which the component storage tape 243 travels inside the feeder main body 2411 into two, upper and lower paths (an upper side path 2414AA and a lower side path 2414AB), and also supports the component storage tape 243 that passes through the upper side path 2414AA from below. More specifically, the rear end portion of the tape travelling path 2414A has a shape that spreads in the vertical direction from the front to the rear. The tape support member 2414 is inserted into the tape travelling path 2414A from the rear of the feeder main body 2411 and is detachably fixed to the feeder main body 2411. In this manner, the rear end portion of the tape travelling path 2414A is divided into the upper side path 2414AA and the lower side path 2414AB by the tape support member 2414.

The first tape detection sensor 2416A and the second tape detection sensor 2416B are provided so as to face the tape travelling path 2414A and detect the presence or absence of the component storage tape 243 passing through the tape travelling path 2414A. More specifically, the first tape detection sensor 2416A is provided in front of a merging point of the upper side path 2414AA and the lower side path 2414AB and at a position facing the tape travelling path 2414A from below. On the other hand, the second tape detection sensor 2416B is provided at a position facing the upper side path 2414AA from above, and, in this manner, detects the presence or absence of the component storage tape 243 in the upper side path 2414AA.

The operation input unit 2415 is used by the operator to send out and reversely send the component storage tape 243 as necessary.

Figure 7:
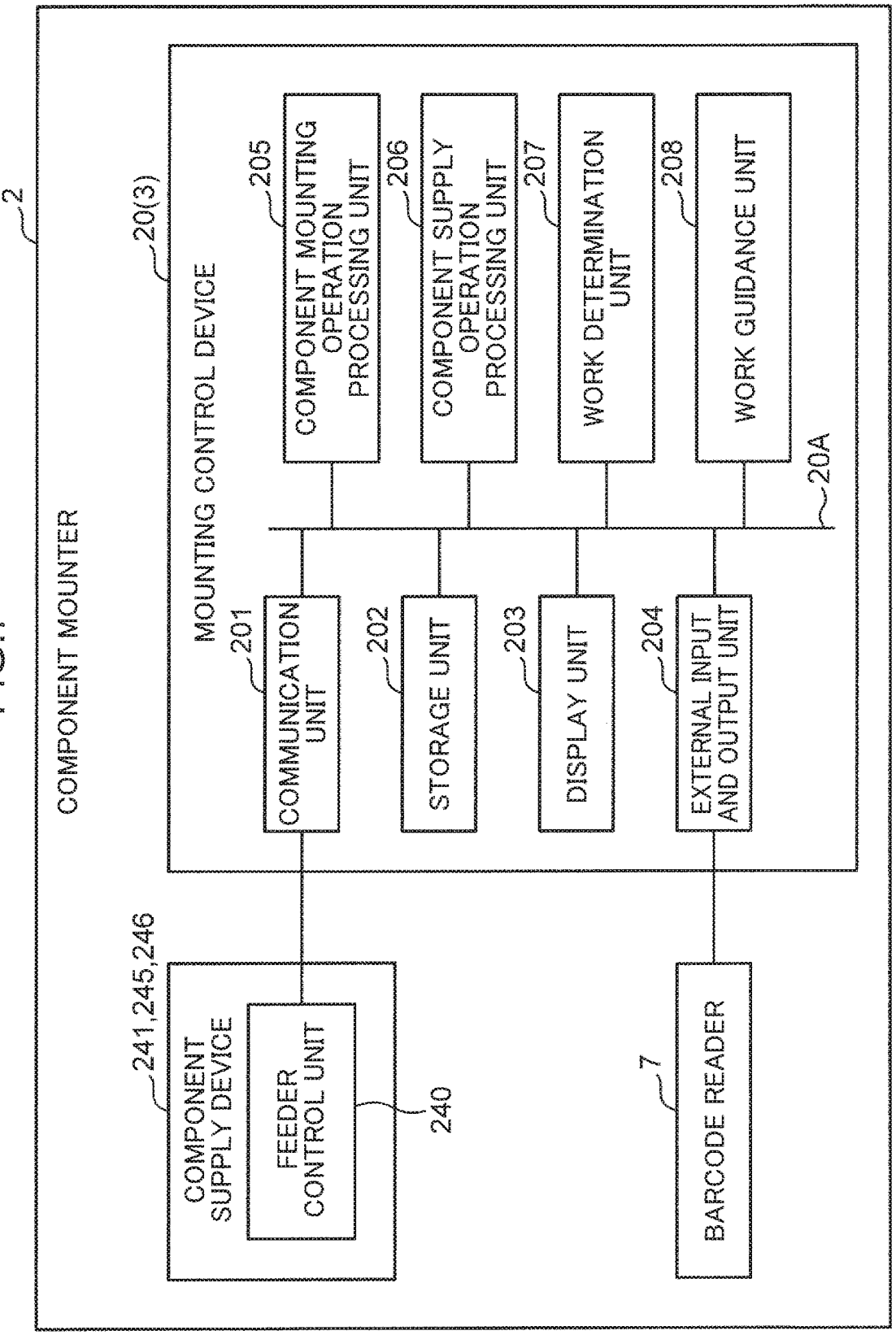
FIG. 7 is a block diagram showing a control system of the component mounter.

A component supply operation of the AF 241 configured as above is as described below. First, as a preparatory work, an operator attaches the reel 2420, around which the preceding component storage tape 243 is wound, to the first reel holder 2419A on a lower stage of the reel support unit 2419. At this time, the operator performs reading operation of reading a component type identifying barcode BR (recording portion, see FIG. 3) provided on the reel 2420 with a barcode reader 7 (FIG. 7). The component type identifying barcode BR is obtained by encoding and recording replenishment component type information or the like for identifying a component type of the component E stored in the component storage tape 243 wound around the reel 2420.

The operator inserts a front end portion of the component storage tape 243 wound around the reel 2420 attached to the first reel holder 2419A into the upper side path 2414AA from the rear of the feeder main body 2411. In this manner, the front end portion of the preceding component storage tape 243 is supported by the tape support member 2414 in a state of being fitted to the first sprocket 2412A. Thereafter, the operator operates the operation input unit 2415 to input an instruction to rotate the first sprocket 2412A, send out the component storage tape 243, and fit the front end portion of the component storage tape 243 to the second sprocket 2413A.

The component supply operation of the AF 241 is started in a state where the above-mentioned preparation work is finished. In the AF 241, the second sprocket 2413A rotates, which causes the component storage tape 243 to be sent out. Note that the first sprocket 2412A is configured to idle, and, at this time, the component storage tape 243 can be sent out only by rotation of the second sprocket 2413A.

Next, the operator removes the tape support member 2414 from the feeder main body 2411 in a state where the preceding component storage tape 243 is being sent out from the reel 2420. When the tape support member 2414 is removed, the component storage tape 243 is displaced to a bottom surface portion of the tape travelling path 2414A by its own weight. In this manner, the fitting of the preceding component storage tape 243 to the first sprocket 2412A is released. At this time, since the component storage tape 243 is fitted to the second sprocket 2413A, even if the fitting to the first sprocket 2412A is released, the component storage tape 243 continues to be sent out by the rotation of the second sprocket 2413A.

Next, in a state where the preceding component storage tape 243 is being sent out from the reel 2420, the operator mounts the tape support member 2414 on the feeder main body 2411 and moves the reel 2420, around which the preceding component storage tape 243 is wound, from the first reel holder 2419A on the lower stage to the second reel holder 2419B on the upper stage. Next, in a state where the preceding component storage tape 243 is being sent out from the reel 2420 supported by the second reel holder 2419B on the upper stage, the operator attaches the reel 2420, around which the subsequent component storage tape 243 is wound, to the first reel holder 2419A on the lower stage, and inserts a front end portion of the component storage tape 243 into the upper side path 2414AA from the rear of the feeder main body 2411. In this manner, the front end portion of the subsequent component storage tape 243 is supported by the tape support member 2414 in a state of being fitted to the first sprocket 2412A. In this manner, the reel 2420 around which the subsequent component storage tape 243 is wound can be mounted in a state where the preceding component storage tape 243 wound around the reel 2420 does not run out of the component. Note that, even when mounting the reel 2420 around which the subsequent component storage tape 243 is wound, the operator performs the reading operation of reading the component type identifying barcode BR provided on the reel 2420 with the barcode reader 7 (FIG. 7), similar to the case of the preceding component storage tape 243.

Thereafter, all the preceding component storage tape 243 is pulled out from the reel 2420 supported by the second reel holder 2419B on the upper stage, and its rear end passes through the position of the second tape detection sensor 2416B. When the absence of the preceding component storage tape 243 is detected, sending out of the subsequent component storage tape 243 from the reel 2420 supported by the first reel holder 2419A on the lower stage is automatically started. Then, the operator removes the reel 2420 that has run out of the component from the second reel holder 2419B on the upper stage, and moves the reel 2420, around which the subsequent component storage tape 243 is wound, from the first reel holder 2419A on the lower stage to the second reel holder 2419B on the upper stage. At this time, the operator can replenish the AF 241 with a new reel around which the component storage tape 243 is wound. The new reel with which the AF 241 is replenished is attached to the first reel holder 2419A on the lower stage by the operator. Also at this time, the operator performs the reading operation of reading the component type identifying barcode provided on the new reel with the barcode reader 7. Here, the timing of the component replenishment work with the new reel is identified by the replenishment plan management device 30 of the component replenishment management system 3 without being restricted to a time point at which the reel 2420 around which the preceding component storage tape 243 is wound runs out of the component.

Note that, in a state where the preceding component storage tape 243 is sent out from the reel 2420 supported by the second reel holder 2419B on the upper stage, and a front end portion of the subsequent component storage tape 243 wound around the reel 2420 supported by the first reel holder 2419A on the lower stage is inserted in the upper side path 2414AA, a new reel cannot be mounted. On the other hand, in a state where all the preceding component storage tape 243 is pulled out from the reel 2420 supported by the second reel holder 2419B on the upper stage, and sending out of the subsequent component storage tape 243 from the reel 2420 supported by the first reel holder 2419A on the lower stage is automatically started, a new reel can be mounted.

(Tray Feeder)

Figure 5:
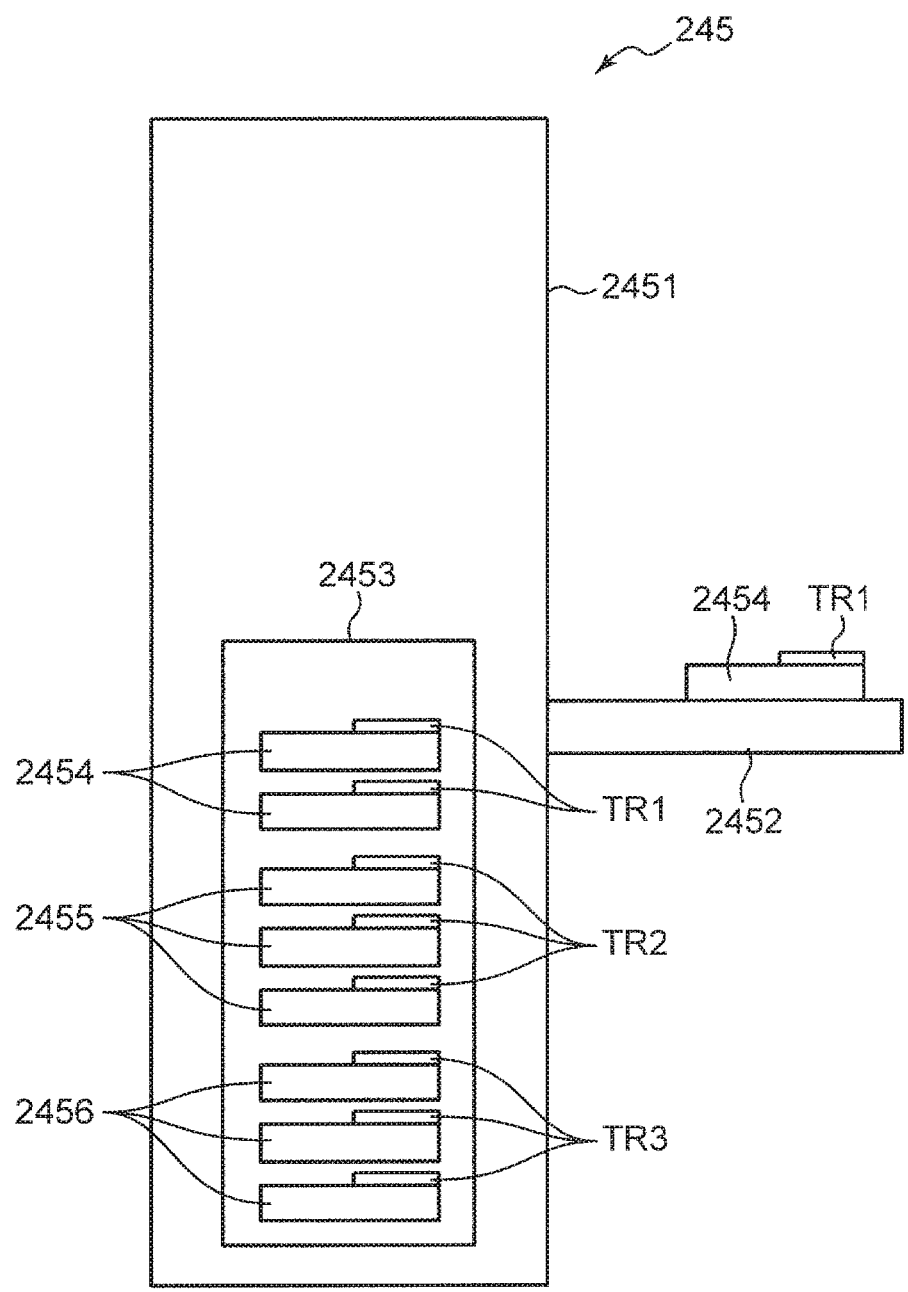
FIG. 5 is a diagram schematically showing a tray feeder as the component supply device disposed in the component supply unit of the component mounter.

Next, the tray feeder as the component supply device will be described with reference to FIG. 5. FIG. 5 is a diagram schematically showing a configuration of a tray feeder 245. A plurality of tray feeders 245 can be installed side by side in the component supply unit 24. The tray feeder 245 is configured such that one magazine 2453 can move vertically in a cover body 2451. The magazine 2453 accommodates a plurality of first pallets 2454, a plurality of second pallets 2455, and a plurality of third pallets 2456.

At least one first tray TR1 holding a plurality of components is placed on each of the first pallets 2454. The components held in the first tray TR1 are the same type of the components for each of the first pallets 2454. Similarly, at least one second tray TR2 holding a plurality of components is placed on each of the second pallets 2455. The components held in the second tray TR2 are the same type of the components for each of the second pallets 2455. However, the type of the component held on the second tray TR2 is different from that of the component held on the first tray TR1. Further, at least one third tray TR3 holding a plurality of components is placed on each of the third pallets 2456. The components held in the third tray TR3 are the same type of the components for each of the third pallets 2456. However, the type of the component held on the third tray TR3 is different from that of the component held on each of the first tray TR1 and the second tray TR2.

Each of the first pallet 2454, the second pallet 2455, and the third pallet 2456 has a function as the component storage member on which the tray TR1, TR2, or TR3 holding a plurality of components is placed. Each of the first pallet 2454, the second pallet 2455, and the third pallet 2456 housed in the magazine 2453 is moved to a table 2452 that is provided so as to project outward from the cover body 2451 during production of the component mounting substrate, and, in this manner, the components are supplied in a state of being held by the trays TR1, TR2, and TR3.

During the production of the component mounting substrate, even if the component held in the first tray TR1 placed on one of the plurality of first pallets 2454 runs out, another first pallet 2454 is moved to the table 2452, and, in this manner, the component is supplied in a state of being held by the first tray TR1. At this time, the operator can take out the first pallet 2454 that has run out of the component from the cover body 2451 and replenish the tray feeder 245 with a new first pallet during the production of the component mounting substrate. Similarly, during the production of the component mounting substrate, even if the component held in the second tray TR2 placed on one of the plurality of second pallets 2455 runs out, another second pallet 2455 is moved to the table 2452, and, in this manner, the component is supplied in a state of being held by the second tray TR2. At this time, the operator can take out the second pallet 2455 that has run out of the component from the cover body 2451 and replenish the tray feeder 245 with a new second pallet during the production of the component mounting substrate. Further, during the production of the component mounting substrate, even if the component held in the third tray TR3 placed on one of the plurality of third pallets 2456 runs out, another third pallet 2456 is moved to the table 2452, and, in this manner, the component is supplied in a state of being held by the third tray TR3. At this time, the operator can take out the third pallet 2456 that has run out of the component from the cover body 2451 and replenish the tray feeder 245 with a new third pallet during the production of the component mounting substrate.

Note that, when replenishing the tray feeder 245 with a new pallet, the operator performs the reading operation of reading a component type identifying barcode provided on the new pallet with the barcode reader 7. The replenishment plan management device 30 of the component replenishment management system 3 performs management regarding a plan of the component replenishment work for the tray feeder 245 with a new pallet.

(Stick Feeder)

Figure 6:
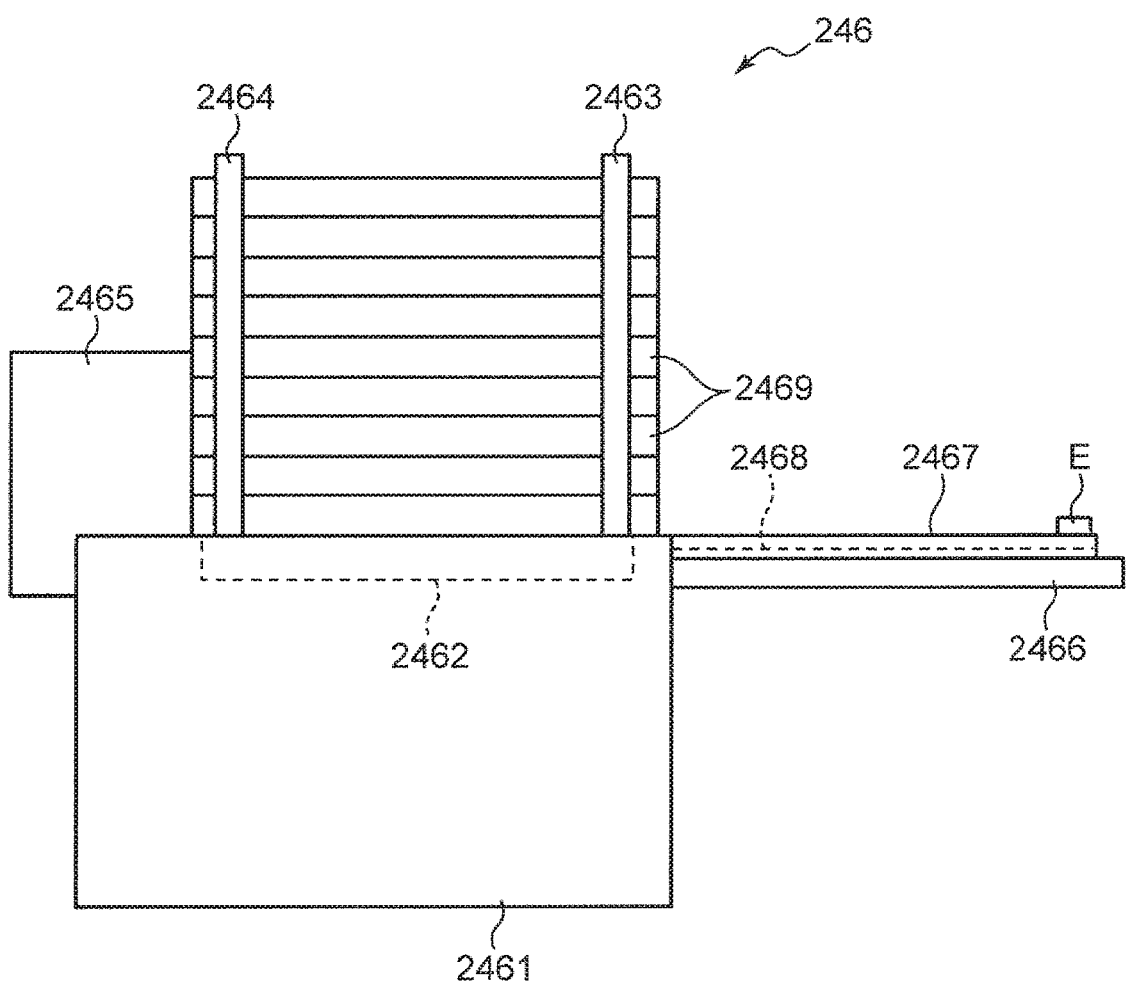
FIG. 6 is a diagram schematically showing a stick feeder as the component supply device disposed in the component supply unit of the component mounter.

Next, a stick feeder as the component supply device will be described with reference to FIG. 6. FIG. 6 is a diagram schematically showing a configuration of the stick feeder 246. A plurality of stick feeders 246 can be provided side by side in the component supply unit 24. The stick feeder 246 is configured to supply the component E stored in a stick 2469 as a cylindrical component storage member while pushing the component E out from the stick 2469. The stick feeder 246 includes a frame main body 2461, a stick table 2462 provided in an upper portion of the frame main body 2461, a first chuck 2463 and a second chuck 2464, a component pushing-out mechanism unit 2465, a guide frame 2466, a pair of guide rails 2467, and a conveyor belt 2468.

The frame main body 2461 has a hollow box shape with an open top. The stick table 2462 is arranged on an inner side of the upper portion of the frame main body 2461. A plurality of sticks 2469 can be placed in a stacked state on the stick table 2462. The first chuck 2463 can simultaneously hold front end portions of the sticks 2469 other than the lowest one of the plurality of sticks 2469 on the stick table 2462. Similarly, the second chuck 2464 can simultaneously hold rear end portions of the sticks 2469 other than the lowest one of the plurality of sticks 2469 on the stick table 2462.

The component pushing-out mechanism unit 2465 pushes the component E forward from the lowest stick 2469 of the plurality of sticks 2469 on the stick table 2462. The guide frame 2466 is fixed to a front portion of the frame main body 2461, and a pair of guide rails 2467 are supported by the guide frame 2466. Then, the conveyor belt 2468 is provided between the pair of guide rails 2467. The component E pushed forward by the component pushing-out mechanism unit 2465 is conveyed by the conveyor belt 2468 along the pair of guide rails 2467. In this manner, the component E stored in the stick 2469 is supplied to the component supply position.

When the lowest stick 2469 runs out of the component due to the component supply operation, the first and second chucks 2463 and 2464 hold the sticks 2469 other than the lowest stick 2469. In this state, the stick table 2462 is displaced to a support releasing position for releasing the support of the stick 2469, so that only the lowest stick 2469 is dropped to an inner bottom portion of the frame main body 2461 by its own weight. Note that, after the stick 2469 that has run out of the component is discarded, the stick table 2462 returns to the support position of the stick 2469, and the first and second chucks 2463 and 2464 are opened, so that the remaining sticks 2469 are placed on the stick table 2462, and the component E is supplied from the next (lowest) stick 2469.

During production of the component mounting substrate, when the stick 2469 that has run out of the component drops on the inner bottom portion of the frame main body 2461, the operator can replenish the stick feeder 246 with a new stick. Note that, when replenishing the stick feeder 246 with a new stick, the operator performs the reading operation of reading a component type identifying barcode provided on the new stick with the barcode reader 7.

The replenishment plan management device 30 of the component replenishment management system 3 performs management regarding a plan of component replenishment work for the stick feeder 246 with a new stick.

[Configuration of Component Replenishment Management System]

The component replenishment management system 3 is a system that manages the component replenishment work performed by an operator according to the production of a component mounting substrate. The component replenishment work includes replenishment work with a new reel for replenishment for the AF 241, replenishment work with a new pallet for replenishment for the tray feeder 245, replenishment work with a new stick for replenishment for the stick feeder 246, and splicing work for the splicing feeder.

As described in FIG. 1, the component replenishment management system 3 includes the mounting control device 20 provided in each of the component mounters 2 that constitutes the component mounting line 2L, the replenishment plan management device 30, and the mobile terminal device 30T carried by an operator.

<Regarding Mounting Control Device>

The mounting control device 20 constituting part of the component replenishment management system 3 will be described with reference to a block diagram of FIG. 7. The mounting control device 20 is provided in the component mounter 2. The mounting control device 20 is a device that integrally controls the component mounting operation of the component mounter 2 and component supply operation of the component supply devices including the AF 241, the tray feeder 245, and the stick feeder 246, and also executes control related to the component replenishment work for the component supply device by the operator. The mounting control device 20 includes, for example, a microcomputer incorporating a storage device such as a read only memory (ROM) that stores a control program, a flash memory that temporarily stores data, or the like, and executes control of the component mounting operation and the component supply operation, and control related to the component replenishment work by reading the control program. The mounting control device 20 includes a communication unit 201, a memory unit 202, a display unit 203, an external input and output unit 204, a component mounting operation processing unit 205, a component supply operation processing unit 206, a work determination unit 207, and a work guidance unit 208 which are connected via a bus 20A.

The communication unit 201 is an interface for performing data communication with the component supply device, the replenishment plan management device 30, and the mobile terminal device 30T. All the component supply devices disposed in each of the component supply units 24 of the component mounter 2 are connected to the communication unit 201. The external input and output unit 204 is an interface for data communication with the barcode reader 7. The external input and output unit 204 is an information acquisition unit that acquires replenishment component type information for identifying a component type of the component stored in the component storage member, the component type being read from the component type identifying barcode of the component storage member by the reading operation using the barcode reader 7 by the operator.

The memory unit 202 stores attachment information JH1 shown in FIG. 8. The attachment information JH1 is information on the component in the component supply device disposed in each of the component supply units 24 of the component mounter 2. The attachment information JH1 associates mounter type information J11, set position information J12, device type information J13, component type information J14, preceding component remaining number information J15, total component remaining number information J16, component remaining number warning value information J17, and component remaining number stop value information J18 with each other. The mounter type information J11 is information for identifying the component mounter 2. The set position information J12 is information indicating a position within the component supply unit 24 of the component supply device. In a case where the component supply device is the AF 241, the set position information J12 is information identified by a position of the slot 2417B in the feeder attachment unit 2417A. Slot numbers different from each other are assigned to the slots 2417B, and the position of each of the slots 2417B, that is, a set position is identified by this slot number. The device type information J13 is information indicating a type of the component supply device (type of a component supply system).

The component type information J14 is information for identifying a component type of the component supplied by each of the component supply devices, and is indicated by identification information for identifying the component, component name information indicating the name of the component, or the like. The preceding component remaining number information J15 is information indicating the remaining number of components of the preceding component storage member in each of the component supply devices. The total component remaining number information J16 is information indicating the total number of remaining components in each of the component supply devices. The component remaining number warning value information J17 is information indicating that the total number of remaining components represented by the total component remaining number information J16, before the component runs out in each component supply device, has a predetermined value (component remaining number warning value) for which a warning needs to be issued. The component remaining number stop value information J18 is information that is particularly applied to the splicing feeder, and information indicating that the total number of remaining components represented by the total component remaining number information J16 has a predetermined value (component remaining number stop value) for which sending out of the tape for the splicing work needs to be stopped. In the splicing feeder, the splicing work to join tapes for replenishment cannot be performed even if the sending out of a preceding component storage tape is stopped after the remaining number of components in the preceding component storage tape becomes "0: zero". For this reason, in the splicing feeder, the component remaining number stop value represented by the component remaining number stop value information J18 is normally preferably set to a value larger than "0: zero". Unlike the splicing feeder, the AF 241, the tray feeder 245, and the stick feeder 246 do not have the concept of "a predetermined value for which sending out of the tape feeding needs to be stopped for the splicing work". Therefore, in the AF 241, the tray feeder 245, and the stick feeder 246, the component remaining number stop value represented by the component remaining number stop value information J18 is normally preferably set to "0: zero" which is when the component actually runs out, or to a value smaller than the component remaining number warning value.

The display unit 203 displays information transmitted from the replenishment plan management device 30 described later and received by the communication unit 201, information generated by the work guidance unit 208, and the like. The component mounting operation processing unit 205 controls the operation of the head unit 25 and the like in the production of the component mounting substrate by the component mounter 2. The component supply operation processing unit 206 performs processing of integrally controlling the operation of each of the component supply devices by transmitting a control signal to a feeder control unit 240 of each of the component supply devices via the communication unit 201.

The work determination unit 207 determines whether or not the component replenishment work of replenishing the component supply device with the component storage member for replenishment can be performed at a timing at which the external input and output unit 204 acquires the replenishment component type information via the barcode reader 7. In a case where the work determination unit 207 determines that the component replenishment work cannot be performed, the work guidance unit 208 generates performing process guidance information that guides a performing process of the component replenishment work. Details of the work determination unit 207 and the work guidance unit 208 will be described later.

Note that, as shown in FIG. 2, a work area WA in which the component replenishment work is performed by an operator is set in the component mounter 2. In the present embodiment, the work area WA including the component supply unit 24 disposed on the −Y side of the component mounter 2 and the work area WA including the component supply unit 24 disposed on the +Y side of the component mounter 2 are set in the component mounter 2. In the component mounting line 2L in which a plurality of component mounters 2 are connected, the work areas WA positioned on the −Y side of the component mounters 2 are disposed side by side in the X-axis direction, and the work areas WA positioned on the +Y side of the component mounters 2 are disposed side by side in the X-axis direction.

<Regarding Replenishment Plan Management Device>

The replenishment plan management device 30 is a device that manages a plan of the component replenishment work performed by the operator in the work area WA set to each of the component mounters 2. As shown in FIG. 1, the replenishment plan management device 30 is connected to the mounting control device 20 of each of the component mounters 2, the production plan management device 4, and the substrate information management device 5 in a data communicable manner. Further, the replenishment plan management device 30 includes, for example, a microcomputer, and includes a communication unit 31, an operation unit 32, a display unit 33, and a control unit 34, as shown in a block diagram of FIG. 9.

The communication unit 31 is an interface for realizing data communication with the mounting control device 20 of each of the component mounters 2, the production plan management device 4, and the substrate information management device 5. The communication unit 31 acquires information transmitted from the mounting control device 20 of each of the component mounters 2, the production plan management device 4, and the substrate information management device 5, and provides the acquired information to the control unit 34. Further, the communication unit 31 is provided with work list information generated by a replenishment management unit 342 from the control unit 34, and transmits (outputs) the work list information to the mounting control device 20 of each of the component mounters 2. Note that the work list information generated by the replenishment management unit 342 is transmitted from the mounting control device 20 to the mobile terminal device 30T carried by the operator.

The operation unit 32 includes a touch panel, a numeric keypad, a start key, a setting key, and the like, and receives operation of the operator and various settings on the replenishment plan management device 30. The display unit 33 displays the performing process guidance information generated by the work guidance unit 208 of the mounting control device 20 and input via the communication unit 31, and the work list information generated by the replenishment management unit 342.

Here, the production plan management device 4 and the substrate information management device 5, which are connected to the replenishment plan management device 30 in a data communicable manner, will be described. The production plan management device 4 is a device for managing the production plan of the component mounting substrate by each of the component mounters 2. The production plan management device 4 includes, for example, a microcomputer. The production plan management device 4 transmits production plan information regarding the production plan of the component mounting substrate to the replenishment plan management device 30 by the operation by the operator who makes the production plan. FIG. 10 is a diagram for describing production plan information JH2 transmitted from the production plan management device 4 and input to the replenishment plan management device 30. The production plan information JH2 is information in which production order information J21, substrate type information J22, production quantity information J23, and cycle time information J24 are associated. The production order information J21 is information indicating the production order of the component mounting substrate. The substrate type information J22 is information indicating a type of the substrate P used for the production of the component mounting substrate. The production quantity information J23 is information indicating the production quantity of the component mounting substrate for each substrate type. The cycle time information J24 is information indicating the time (second/sheet) required to finish one component mounting substrate when the component is mounted on the substrate P.

Figure 11:
FIG. 11 is a diagram for describing substrate information input to the replenishment plan management device.

The substrate information management device 5 is a device for managing substrate information that is referred to at the time of the production of the component mounting substrate by each of the component mounters 2. The substrate information management device 5 includes, for example, a microcomputer. The substrate information management device 5 transmits the substrate information to the replenishment plan management device 30 by the operation of the operator. FIG. 11 is a diagram for describing substrate information JH3 transmitted from the substrate information management device 5 and input to the replenishment plan management device 30. The substrate information JH3 is information in which the substrate type information J22, the set position information J12, the component type information J14, and component required number information J31 are associated. The component required number information J31 is information regarding the required number (number/sheet) of the components necessary for production of one component mounting substrate. The substrate information JH3 is rewritten every time a type of the substrate P indicated by the substrate type information J22 is switched.

The substrate information JH3 is transmitted to the mounting control device 20 of each of the component mounters 2 via the replenishment plan management device 30 and is referred to at the time of production of the component mounting substrate by each of the component mounters 2. Specifically, the component mounting operation processing unit 205 of the mounting control device 20 controls the operation of the head unit 25 and the like based on the substrate information JH3 in the production of the component mounting substrate by the component mounter 2. In the substrate information JH3, at the time of production of the substrate type indicated by the substrate type information J22, when the component is supplied by the component supply device disposed at the set position indicated by the set position information J12, the head unit 25 is controlled to take out the component indicated by the component type information J14 from the component supply device. The substrate information management device 5 stores the substrate information JH3 of the substrate type currently produced. In other words, when the substrate information JH3 stored in the substrate information management device 5 is transmitted to the mounting control device 20 via the replenishment plan management device 30, the component mounting substrate is produced based on the substrate information JH3. Therefore, in order to produce a substrate of a next substrate type after the production of the substrate of the substrate type of the current substrate information JH3 is finished, the substrate information JH3 of the next substrate type must be stored in the substrate information management device 5.

Figure 9:
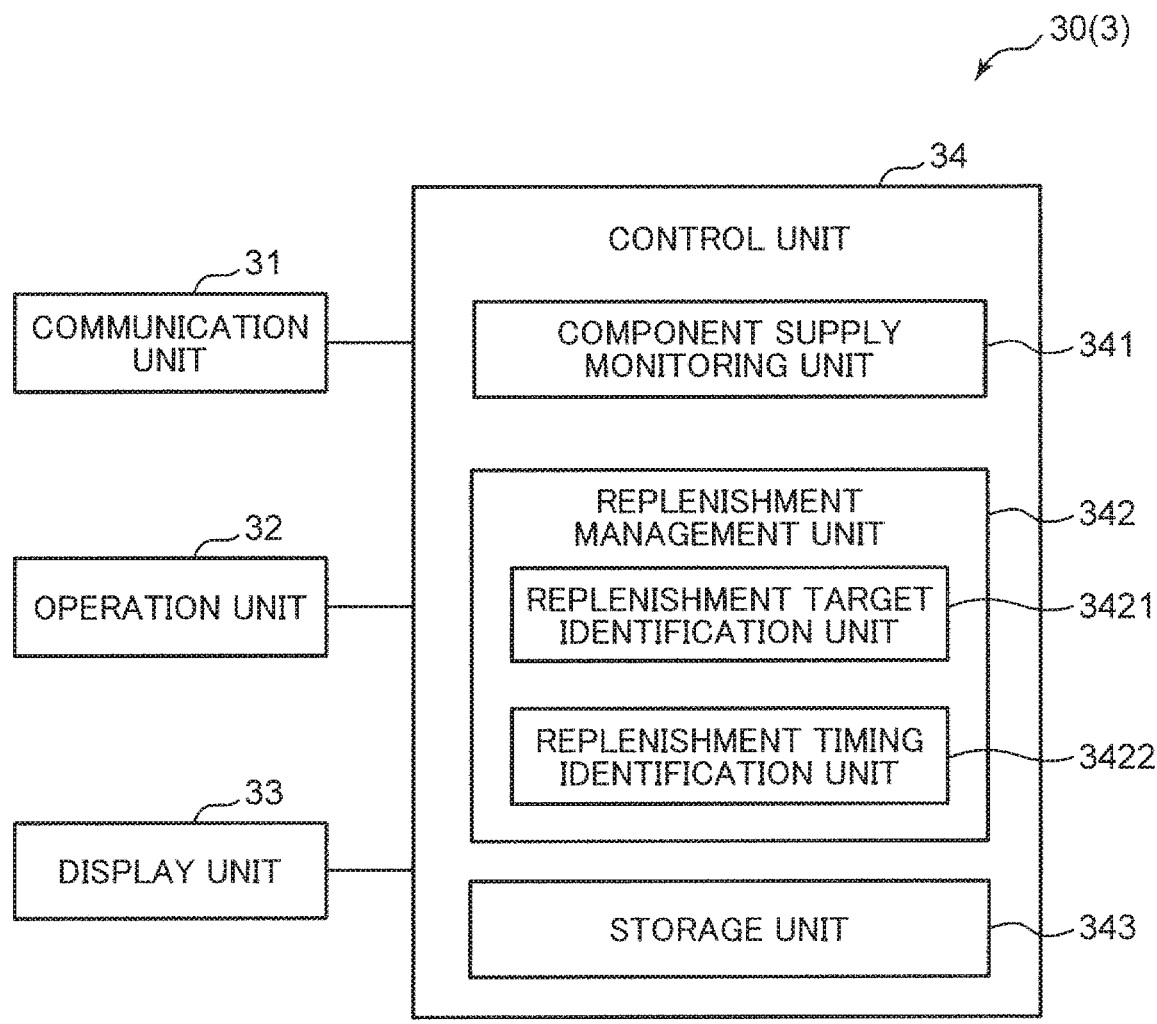
FIG. 9 is a block diagram of a replenishment plan management device that constitutes the component replenishment management system.

The control unit 34 of the replenishment plan management device 30 includes a central processing unit (CPU), a read only memory (ROM) that stores a control program, a random access memory (RAM) used as a work area of the CPU, and the like. The control unit 34 controls the communication unit 31, the operation unit 32, and the display unit 33 as the CPU executes the control program stored in the ROM, and also generates various types of information regarding the management of the plan of the component replenishment work. As shown in FIG. 9, the control unit 34 includes a component supply monitoring unit 341, the replenishment management unit 342, and a memory unit 343.

Figure 12:
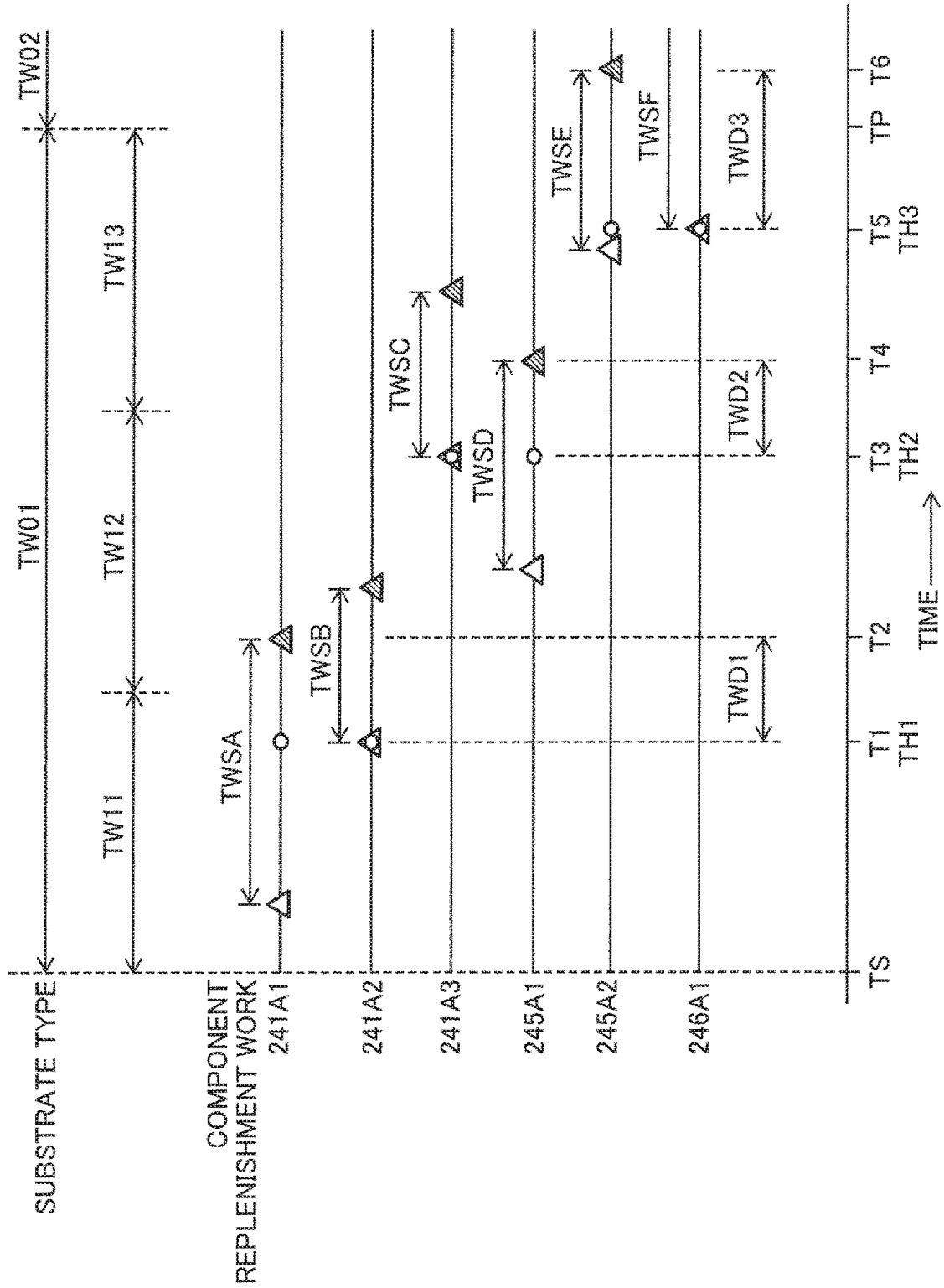
FIG. 12 is a diagram for describing control operation of a component supply monitoring unit and a replenishment management unit in the replenishment plan management device.
Figure 14:
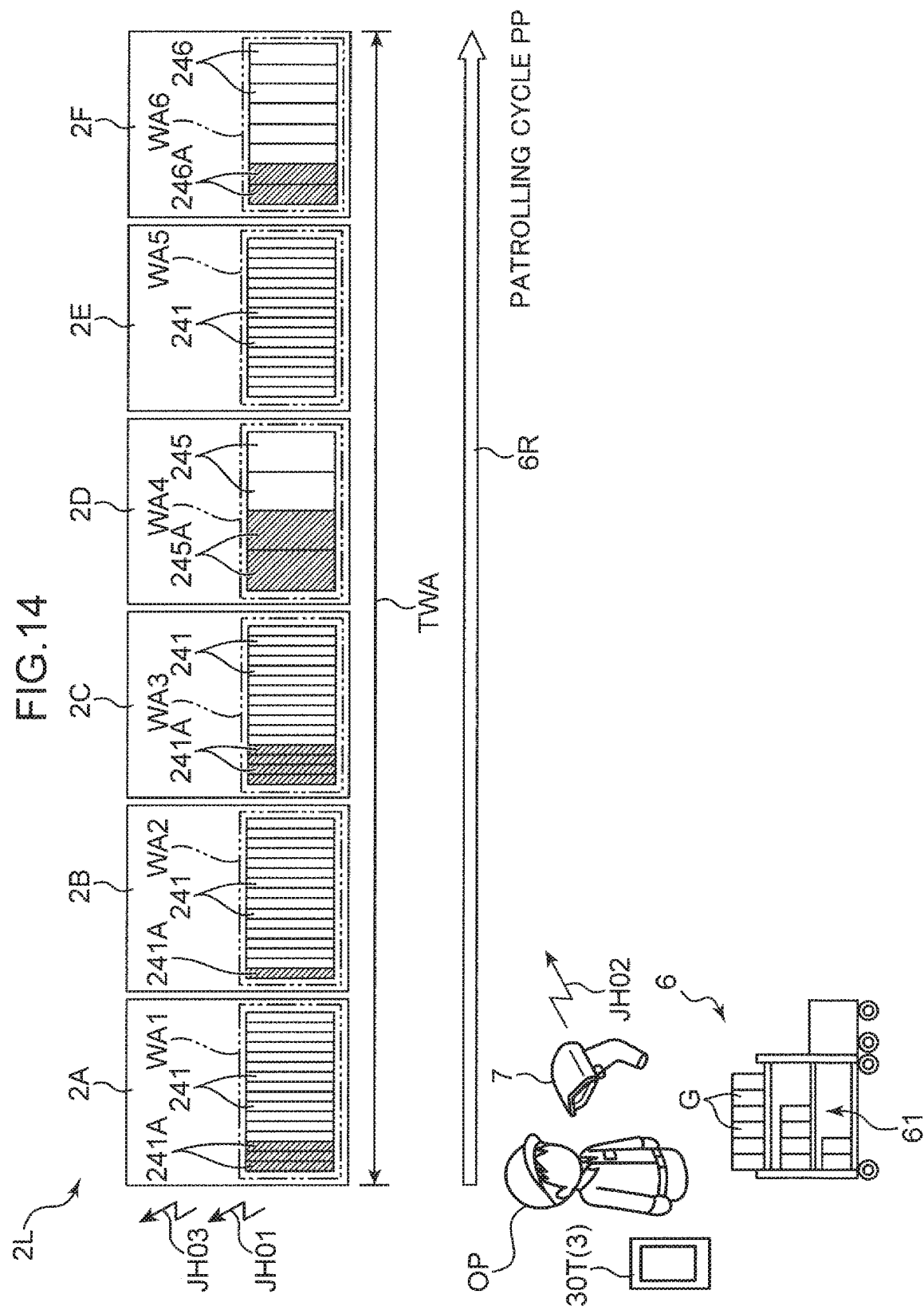
FIG. 14 is a diagram for describing operation of the component replenishment management system.

With reference to FIG. 12 to FIG. 14 in addition to FIG. 9, the component supply monitoring unit 341, the replenishment management unit 342, and the memory unit 343 in the control unit 34 will be described. FIG. 12 is a diagram for describing the control operation of the component supply monitoring unit 341 and the replenishment management unit 342. FIG. 13 is a diagram for describing work list information JH4 generated by the component supply monitoring unit 341 and the replenishment management unit 342. FIG. 14 is a diagram for describing the operation of the component replenishment management system 3.

As shown in FIG. 14, a work area TWA is set on the component mounting line 2L. The work area TWA represents a range in which one operator OP is in charge of the component replenishment work for the component supply device attached to each of the component mounters 2 of the component mounting line 2L. The work area TWA includes the work area WA set in the component mounter 2 disposed in the work area TWA. In a case where the component mounters 2 for which the operator OP is in charge of the component replenishment work are placed on a plurality of component mounting lines 2L, the work area TWA includes the plurality of component mounting lines 2L.

The operator OP carries the mobile terminal device 30T, moves on a movement route 6R along the component mounting line 2L that passes through the work area WA of each of the component mounters 2 while pushing a cart 6 in the work area TWA, and performs the component replenishment work in each of the work areas WA. Note that the cart 6 has a cargo portion 61 capable of accommodating an article G for the component replenishment work. The articles G accommodated in the cargo portion 61 include a new component storage member for replenishment (reel, pallet, or stick) necessary for the component replenishment work, a collected product recovered after the component replenishment work, and the like. Further, the cart 6 may be unmanned transported by using an automated guided vehicle (AGV) which is an unmanned guided vehicle. In this case, AGV instruction data created based on the work list information JH4 described later is distributed to the AGV. The AGV instruction data is a file in which a position of the work area WA at which the AGV should stop and stop time are described. In the work area TWA, the AGV sequentially moves to and stops at each of the work areas WA along the movement route 6R so as to guide the operator OP. In this manner, the operator OP can move along the movement route 6R with the AGV as a mark, and perform the component replenishment work in the work area WA at the position where the AGV is stopped.

Note that, in the example shown in FIG. 14, in the work area TWA, the component mounters 2 of the component mounting line 2L are shown as a first component mounter 2A, a second component mounter 2B, a third component mounter 2C, a fourth component mounter 2D, a fifth component mounter 2E, and a sixth component mounter 2F in order from the upstream side to the downstream side of the movement route 6R. Further, the work area set in the first component mounter 2A is shown as a first work area WA1, and, similarly, the work area of the second component mounter 2B is shown as a second work area WA2, the work area of the third component mounter 2C is shown as a third work area WA3, the work area of the fourth component mounter 2D is shown as a fourth work area WA4, the work area of the fifth component mounter 2E is shown as a fifth work area WA5, and the work area of the sixth component mounter 2F is shown as a sixth work area WA6. Note that the work area TWA may be set to include the plurality of component mounting lines 2L as described above. Further, the movement route 6R in the work area TWA is a route set to pass through the work area WA in which the component supply device as a target of the component replenishment work is disposed in the work area WA disposed on the −Y side and the +Y side of each of the component mounters 2 in each of the component mounting lines 2L, and is not limited to the route along the component mounting line 2L as shown in FIG. 14. For example, a route that passes in a zigzag manner between the work area WA disposed on the −Y side of each of the component mounters 2 and the work area WA disposed on the +Y side may be set as the movement route 6R, and in some cases, a route that passes in one direction and then returns may be set as the movement route 6R.

(Regarding Component Supply Monitoring Unit)

The component supply monitoring unit 341 will be described mainly with reference to FIG. 12. FIG. 12 shows an example in which the component mounting substrate of a first substrate type is produced in a first production period TWO1, and then the substrate type is switched and the component mounting substrate of a second substrate type is produced in a second production period TWO2. Further, FIG. 12 shows an example in which, in the first production period TWO1, the component is supplied from three AFs 241A1, 241A2, and 241A3, two tray feeders 245A1 and 245A2, and one stick feeder 246A1 among the plurality of component supply devices provided in each of the component mounters 2 of the component mounting line 2L to produce the component mounting substrate. The component replenishment work that the operator OP is to perform according to the production of the component mounting substrate includes the component replenishment work for replenishing each of the AFs 241A1, 241A2, and 241A3 with a new reel for replenishment, the component replenishment work for replenishing each of the tray feeders 245A1 and 245A2 with a new pallet for replenishment, and the component replenishment work for replenishing the stick feeder 246A1 with a new stick for replenishment. The AFs 241A1, 241A2, and 241A3, the tray feeders 245A1 and 245A2, and the stick feeder 246A1 may be collectively referred to as the "component supply devices 241, 245, and 246", and a reel, a pallet, and a stick may be collectively referred to as the "component storage members".

First, the component supply monitoring unit 341 acquires a management start time TS indicating a management start time of a plan of the component replenishment work for each of the AFs 241A, 241B, and 241C, the tray feeders 245A and 245B, and the stick feeder 246A. The component supply monitoring unit 341 may acquire a time to start the production of the component mounting substrate in the first production period TWO1 as the management start time TS, or, in a case where command information for instructing the management start is input via the operation unit 32, may acquire a time at which the command information is input as the management start time TS.

Upon acquiring the management start time TS, the component supply monitoring unit 341 monitors a component supply state in each of the component supply devices 241, 245, and 246 from the management start time TS. The component supply monitoring unit 341 identifies a replenishable time zone that represents a time zone in which the component replenishment work can be performed for each of the component supply devices 241, 245, and 246. In the example shown in FIG. 12, a replenishable time zone TWSA is identified for the AF 241A1, a replenishable time zone TWSB is identified for the AF 241A2, and a replenishable time zone TWSC is identified for the AF 241A3. Further, a replenishable time zone TWSD is identified for the tray feeder 245A1, and a replenishable time zone TWSE is identified for the tray feeder 245A2. Furthermore, a replenishable time zone TWSF is identified for the stick feeder 246A1.

The most early time in each of the replenishable time zones TWSA to TWSF (hereinafter referred to as the "earliest time") is a time when a preceding component storage member, for which component supply is performed first, among the plurality of component storage members mounted in the component supply devices 241, 245, and 246 runs out of the component. When the preceding component storage member runs out of the component, a new component storage member for replenishment can be replenished. That is, when identifying each of the replenishable time zones TWSA to TWSF, the component supply monitoring unit 341 estimates, for each of the component supply devices 241, 245, and 246, replenishable time TT (see FIG. 13) representing time from the management start time TS until the component replenishment work for replenishing with a new component storage member for replenishment becomes possible. Replenishable time information J42, which represents the replenishable time TT for each of the component supply devices 241, 245, and 246 estimated by the component supply monitoring unit 341, is included in the work list information JH4 (FIG. 13) described later.

Further, the most late time in each of the replenishable time zones TWSA to TWSF (hereinafter referred to as the "latest time") is a time when the total number of remaining components in the plurality of component storage members mounted in the component supply devices 241, 245, and 246 reaches the predetermined component remaining number warning value. In order to prevent the supply of the component from the component supply devices 241, 245, and 246 from being stopped, when the total number of remaining components of the plurality of component storage members reaches the component remaining number warning value, the component replenishment work for replenishing with a new component storage member for replenishment needs to be performed. That is, when identifying each of the replenishable time zones TWSA to TWSF, the component supply monitoring unit 341 estimates, for each of the component supply devices 241, 245, and 246, warning time WT (see FIG. 13) representing time until the total number of remaining components reaches the component remaining number warning value and the component replenishment work becomes necessary to be performed. The warning time WT for each of the component supply devices 241, 245, and 246 estimated by the component supply monitoring unit 341 is an example of a component replenishment time limit representing a time limit that is time longer than the replenishable time TT and until the component replenishment work becomes necessary to be performed. Warning time information J43 representing the warning time WT, which is an example of the component replenishment time limit, is included in the work list information JH4 (FIG. 13) described later.

Note that, the latest time in each of the replenishable time zones TWSA to TWSF may be a time at which the total number of remaining components of the plurality of component storage members mounted on the component supply devices 241, 245, and 246 reaches a predetermined component remaining number stop value, or may be a time limit by which the component supply devices 241, 245, and 246 can continue the component supply according to the production of the component mounting substrate. When the total number of remaining components reaches the component remaining number stop value, or when the time limit by which the component supply can be continued is reached, the component replenishment work for replenishing with a new component storage member for replenishment needs to be performed, similar to when the total number of remaining components reaches the component remaining number warning value.

That is, when identifying each of the replenishable time zones TWSA to TWSF, the component supply monitoring unit 341 estimates, for each of the component supply devices 241, 245, and 246, stop time ST (see FIG. 13) representing time until the total number of remaining components reaches the component remaining number stop value and the component replenishment work becomes necessary to be performed, or producible time PT (see FIG. 13) representing time until the time limit by which the component supply can be continued is reached and the component replenishment work becomes necessary to be performed. The stop time ST and the producible time PT for each of the component supply devices 241, 245, and 246 estimated by the component supply monitoring unit 341 are an example of the component replenishment time limit representing a time limit until the component replenishment work becomes necessary to be performed, similar to the warning time WT.

Stop time information J44 representing the stop time ST and producible time information J45 representing the producible time PT, which are an example of the component replenishment time limit, are included in the work list information JH4 (FIG. 13) described later.

The component supply monitoring unit 341 identifies the replenishable time zones TWSA to TWSF for each of the component supply devices 241, 245, and 246 based on the attachment information JH1 from the mounting control device 20 of each of the component mounters 2, the production plan information JH2 from the production plan management device 4, and the substrate information JH3 from the substrate information management device 5, which are information provided from the communication unit 31 to the control unit 34.

Specifically, the component supply monitoring unit 341 first obtains the number of remaining components in the preceding component storage member based on the preceding component remaining number information J15 of the attachment information JH1. Furthermore, the component supply monitoring unit 341 obtains the number of components used per second by dividing a required number for each component identified by the component type information J14 necessary for the production of one component mounting substrate, which is represented by the component required number information J31 of the substrate information JH3 by time required to finish one component mounting substrate for each substrate identified by the substrate type information J22, which is represented by the cycle time information J24 of the production plan information JH2. Then, the component supply monitoring unit 341 obtains the earliest time in each of the replenishable time zones TWSA to TWSF by dividing the number of remaining components in the preceding component storage member by the number of components used per second. On the other hand, the component supply monitoring unit 341 obtains the latest time in each of the replenishable time zones TWSA to TWSF by dividing the number of components obtained by subtracting the component remaining number warning value represented by the component remaining number warning value information J17 from the total number of remaining components represented by the total component remaining number information J16 by the number of components used per second.

The number of remaining components in the preceding component storage member represented by the preceding component remaining number information J15 and the total number of remaining components represented by the total component remaining number information J16 are reduced every time the component is taken out by the head unit 25. Although details will be described later, every time the component is taken out from the preceding component storage member, the preceding component remaining number information J15 is updated. Further, when the preceding component storage member runs out of the component and the component supply devices 241, 245, and 246 are replenished with a new component storage member for replenishment, the number of components stored in the new component storage member for replenishment (initial setting number) is added to the total number of remaining components that changes every time the component is taken out by the head unit 25, so that the total number of remaining components is updated. The number of components stored in a new component storage member for replenishment (initial setting number) is stored in the ROM or the like of the control unit 34 for each component identified by the component type information J14. Note that, in a case where the component storage member in use is used as a new component storage member for replenishment, the initial setting number stored in the ROM or the like of the control unit 34 is rewritten with an actual number of components stored in the component storage member.

The component supply monitoring unit 341 updates an identification result of the replenishable time zone TWSA to TWSF in a predetermined cycle (for example, a cycle of 30 seconds) in response to the update of the preceding component remaining number information J15 and the total component remaining number information J16. Further, the component supply monitoring unit 341 may be configured to identify the replenishable time zones TWSA to TWSF in the first production period TWO1 of the first substrate type, or identify the replenishable time zones TWSA to TWSF in consideration of the production periods of the second and subsequent substrate types in addition to the first substrate type.

(Regarding Replenishment Management Unit)

Next, the replenishment management unit 342 manages a plan of the component replenishment work for each of the AFs 241A1, 241A2, and 241A3, the tray feeders 245A1 and 245A2, and the stick feeder 246A1 based on the replenishable time zones TWSA to TWSF identified by the component supply monitoring unit 341. As shown in FIG. 9, the replenishment management unit 342 includes a replenishment target identification unit 3421 and a replenishment timing identification unit 3422.

The replenishment target identification unit 3421 identifies the component supply device for which the component replenishment work can be performed as a component replenishment target device that is a target of the component replenishment work based on a supply state of the component in each of the component supply devices 241, 245, and 246. Specifically, the replenishment target identification unit 3421 first recognizes an overlapping replenishment time zone in each of the replenishable time zones TWSA to TWSF. In the example shown in FIG. 12, the replenishment target identification unit 3421 recognizes a plurality of overlapping replenishment time zones, a first overlapping replenishment time zone TWD1, a second overlapping replenishment time zone TWD2, and a third overlapping replenishment time zone TWD3, in order from the earliest one in the time series. The first overlapping replenishment time zone TWD1 is a time zone where the replenishable time zone TWSA of the AF 241A1 and the replenishable time zone TWSB of AF 241A2 overlap. The most early time (earliest time) of the first overlapping replenishment time zone TWD1 matches with an earliest time T1 in the replenishable time zone TWSB of the AF 241A2, and the most late time (latest time) of the first overlapping replenishment time zone TWD1 matches with a latest time T2 in the replenishable time zone TWSA of the AF 241A1.

The second overlapping replenishment time zone TWD2 is a time zone in which the replenishable time zone TWSC of the AF 241A3 and the replenishable time zone TWSD of the tray feeder 245A1 overlap. The most early time (earliest time) of the second overlapping replenishment time zone TWD2 matches with an earliest time T3 in the replenishable time zone TWSC of the AF 241A3, and the most late time (latest time) of the second overlapping replenishment time zone TWD2 matches with a latest time T4 in the replenishable time zone TWSD of the tray feeder 245A1. The third overlapping replenishment time zone TWD3 is a time zone in which the replenishable time zone TWSE of the tray feeder 245A2 and the replenishable time zone TWSF of the stick feeder 246A1 overlap. The most early time (earliest time) of the third overlapping replenishment time zone TWD3 matches with an earliest time T5 in the replenishable time zone TWSF of the stick feeder 246A1, and the most late time (latest time) of the third overlapping replenishment time zone TWD3 matches with a latest time T6 in the replenishable time zone TWSE of the tray feeder 245A2.

Then, the replenishment target identification unit 3421 identifies all the component supply devices for which the component replenishment work can be performed in each of the overlapping replenishment time zones TWD1, TWD2, and TWD3 as the component replenishment target devices. The replenishment target identification unit 3421 identifies the component replenishment target device for each of the first to third overlapping replenishment time zones TWD1, TWD2, and TWD3. In the example shown in FIG. 12, the replenishment target identification unit 3421 identifies the AFs 241A1 and 241A2 as the component replenishment target devices for which the component replenishment work can be performed within the first overlapping replenishment time zone TWD1. Further, the replenishment target identification unit 3421 identifies the AF 241A3 and the tray feeder 245A1 as the component replenishment target devices for which the component replenishment work can be performed within the second overlapping replenishment time zone TWD2. Further, the replenishment target identification unit 3421 identifies the tray feeder 245A2 and the stick feeder 246A1 as the component replenishment target devices for which the component replenishment work can be performed within the third overlapping replenishment time zone TWD3.

As described above, the replenishment target identification unit 3421 identifies all the component supply devices for which the component replenishment work can be performed in each of the overlapping replenishment time zones TWD1, TWD2, and TWD3 as the component replenishment target devices. In this manner, for the component supply devices 241, 245, and 246 that can be replenished with a new component storage member for replenishment in each of the overlapping replenishment time zones TWD1, TWD2, and TWD3, "collective replenishment", in which the component replenishment work by the operator OP is collectively performed, becomes possible. For this reason, the frequency of the operator OP going to each of the component mounters 2 provided with the component supply devices 241, 245, and 246 can be reduced, and the load of the component replenishment work by the operator OP can be reduced.

Note that, as described above, when the identification result of the replenishable time zones TWSA to TWSF by the component supply monitoring unit 341 is updated in a predetermined cycle, the replenishment target identification unit 3421 updates the identification result of the component replenishment target device. Further, similar to the component supply monitoring unit 341, the replenishment target identification unit 3421 may be configured to identify the component replenishment target device in the first production period TWO1 of the first substrate type, or identify the component replenishment target device in consideration of the production periods of the second and subsequent substrate types in addition to the first substrate type.

Next, the replenishment timing identification unit 3422 identifies the same replenishment work timing of the component replenishment work for the component replenishment target device identified by the replenishment target identification unit 3421 for the first to third overlapping replenishment time zones TWD1, TWD2, and TWD3. In the example shown in FIG. 12, the replenishment timing identification unit 3422 identifies a first replenishment work timing TH1 as a timing of the component replenishment work within the first overlapping replenishment time zone TWD1, the timing being the same for the AFs 241A1 and 241A2. Further, the replenishment timing identification unit 3422 identifies a second replenishment work timing TH2 as a timing of the component replenishment work within the second overlapping replenishment time zone TWD2, the timing being the same for the AF 241A3 and the tray feeder 245A1. Further, the replenishment timing identification unit 3422 identifies a third replenishment work timing TH3 as a timing of the component replenishment work within the third overlapping replenishment time zone TWD3, the timing being the same for the tray feeder 245A2 and the stick feeder 246A1.

It is desirable that the replenishment timing identification unit 3422 identify the earliest time T1 of the first overlapping replenishment time zone TWD1 as the first replenishment work timing TH1 within the first overlapping replenishment time zone TWD1. The earliest time T1 of the first overlapping replenishment time zone TWD1 is the earliest time in the first overlapping replenishment time zone TWD1. As the earliest time T1 that is the earliest time in the first overlapping replenishment time zone TWD1 is set as the first replenishment work timing TH1 as described above, the operator OP can perform the component replenishment work for the AFs 241A1 and 241A2 collectively in a state where there is enough time.

Similarly, it is desirable that the replenishment timing identification unit 3422 identify the earliest time T3 of the second overlapping replenishment time zone TWD2 as the second replenishment timing TH2 within the second overlapping replenishment time zone TWD2, and identify the earliest time T5 of the third overlapping replenishment time zone TWD3 as the third replenishment timing TH3 within the third overlapping replenishment time zone TWD3.

(Modified Example of Replenishment Management Unit)

Further, the replenishment target identification unit 3421 may be configured to divide the first production period TWO1 into a plurality of specific periods TW11, TW12, and TW13 having a predetermined specific time as a time interval. The specific time defining the time interval of each of the specific periods TW11, TW12, TW13 is input by the operator OP via the operation unit 32, and is set to optional time such as 30 minutes. Hereinafter, in the order from the earliest in the time series, the specific periods are referred to as the first specific period TW11, the second specific period TW12, and the third specific period TW13. The time interval in each of the first to third specific periods TW11, TW12, and TW13 is set to be constant.

The replenishment target identification unit 3421 recognizes the first to third overlapping replenishment time zones TWD1 to TWD3 that overlap in the replenishable time zones TWSA to TWSF corresponding to the component supply devices 241, 245, and 246. Furthermore, the replenishment target identification unit 3421 determines whether or not the earliest time of any one of the first to third overlapping replenishment time zones TWD1 to TWD3 is included in each of the first to third specific periods TW11, TW12, and TW13. In the example shown in FIG. 12, the first specific period TW11 includes the earliest time of the first overlapping replenishment time zone TWD1, the second specific period TW12 includes the earliest time of the second overlapping replenishment time zone TWD2, and the third specific period TW13 includes the earliest time of the third overlapping replenishment time zone TWD3.

In this case, the replenishment target identification unit 3421 identifies the AFs 241A1 and 241A2 as the component replenishment target devices for which the component replenishment work can be performed in a time zone between the earliest time of the first overlapping replenishment time zone TWD1 and the most late time (latest time) of the first specific period TW11 in the first overlapping replenishment time zone TWD1. Further, the replenishment target identification unit 3421 identifies the AF 241A3 and the tray feeder 245A1 as the component replenishment target devices for which the component replenishment work can be performed in a time zone between the earliest time of the second overlapping replenishment time zone TWD2 and the most late time (latest time) of the second specific period TW12 in the second overlapping replenishment time zone TWD2. Further, the replenishment target identification unit 3421 identifies the tray feeder 245A2 and the stick feeder 246A1 as the component replenishment target devices for which the component replenishment work can be performed in a time zone between the earliest time of the third overlapping replenishment time zone TWD3 and the most late time (latest time) of the third specific period TW13 in the third overlapping replenishment time zone TWD3.

The replenishment timing identification unit 3422 identifies the same first replenishment work timing TH1 for the AFs 241A1 and 241A2 in a time zone between the earliest time of the first overlapping replenishment time zone TWD1 and the latest time of the first specific period TW11 in the first overlapping replenishment time zone TWD1. Further, the replenishment timing identification unit 3422 identifies the same second replenishment work timing TH2 for the AF 241A3 and the tray feeder 245A1 in a time zone between the earliest time of the second overlapping replenishment time zone TWD2 and the latest time of the second specific period TW12 in the second overlapping replenishment time zone TWD2. Further, the replenishment timing identification unit 3422 identifies the same third replenishment work timing TH3 for the tray feeder 245A2 and the stick feeder 246A1 in a time zone between the earliest time of the third overlapping replenishment time zone TWD3 and the latest time of the third specific period TW13 in the third overlapping replenishment time zone TWD3.

(Regarding Work List Information Generated by Replenishment Management Unit)

The replenishment target identification unit 3421 of the replenishment management unit 342 generates the work list information JH4 shown in FIG. 13 as information indicating an identification result of the component replenishment target device. The replenishment target identification unit 3421 generates the work list information JH4 for each of the overlapping replenishment time zones TWD1, TWD2, and TWD3 shown in FIG. 12, or the specific periods TW11, TW12, and TW13 which are set when the component replenishment target device is identified. In other words, the work list information JH4 is generated by the replenishment target identification unit 3421 for each of the replenishment timings TH1, TH2, and TH3 (see FIG. 12) identified by the replenishment timing identification unit 3422. The work list information JH4 is information obtained by listing a work target area that represents the work area WA of the component mounter 2, in which the component replenishment target device is disposed, associated with the component replenishment target device for which the component replenishment work is performed in the work target area. In the work list information JH4, the work target areas in which the component replenishment target devices are disposed are arranged in order from the upstream side to the downstream side of the movement route 6R of the operator OP and are listed.

As shown in FIG. 13, the work list information JH4 is information in which work target area number information J41, the mounter type information J11, the set position information J12, the device type information J13, the component type information J14, the total component remaining number information J16, the component required number information J31, replenishable time information J42, warning time information J43, stop time information J44, and producible time information J45 are associated with each other.

Each piece of information constituting the work list information JH4 will be described with reference to FIGS. 13 and 14. In the example shown in FIG. 14, in the first work area WA1 of the first component mounter 2A, a plurality of AFs 241 are disposed. Among them, three of the AFs 241A are identified by the replenishment target identification unit 3421 as the component replenishment target device, and, in this manner, the first work area WA1 is set as the work target area. In the second work area WA2 of the second component mounter 2B, a plurality of AFs 241 are disposed. Among them, one of the AF 241A is identified by the replenishment target identification unit 3421 as the component replenishment target device, and, in this manner, the second work area WA2 is set as the work target area. In the third work area WA3 of the third component mounter 2C, a plurality of AFs 241 are disposed. Among them, four of the AFs 241A are identified by the replenishment target identification unit 3421 as the component replenishment target device, and, in this manner, the third work area WA3 is set as the work target area. In the fourth work area WA4 of the fourth component mounter 2D, a plurality of tray feeders 245 are disposed. Among them, two of the tray feeders 245A are identified by the replenishment target identification unit 3421 as the component replenishment target device, and, in this manner, the fourth work area WA4 is set as the work target area. In the fifth work area WA5 of the fifth component mounter 2E, a plurality of AFs 241 are disposed. However, among them, there exists no device that is identified by the replenishment target identification unit 3421 as the component replenishment target device. In the sixth work area WA6 of the sixth component mounter 2F, a plurality of stick feeders 246 are disposed. Among them, two of the stick feeders 246A are identified by the replenishment target identification unit 3421 as the component replenishment target device, and, in this manner, the sixth work area WA6 is set as the work target area.

The work target area number information J41 is information for identifying each of the work target areas (the first work area WA1, the second work area WA2, the third work area WA3, the fourth work area WA4, and the sixth work area WA6) in which the component replenishment target device identified by the replenishment target identification unit 3421 is disposed.

The replenishable time information J42 is information representing the replenishable time TT until the component replenishment work for replenishing with a new component storage member for replenishment becomes possible for the component replenishment target device disposed at the set position represented by the set position information J12 in each of the work target areas represented by the work target area number information J41. The replenishable time TT for each of the component replenishment target devices represented by the replenishable time information J42 is estimated by the component supply monitoring unit 341. The replenishable time TT changes according to the number of remaining components in the preceding component storage member represented by the preceding component remaining number information J15 or the total number of remaining components represented by the total component remaining number information J16. For this reason, the replenishable time information J42 is updated in a predetermined cycle (for example, a cycle of 30 seconds) in response to the update of the preceding component remaining number information J15 or the total component remaining number information J16.

The warning time information J43 is information that represents the warning time WT until the total number of remaining components represented by the total component remaining number information J16 reaches the component remaining number warning value in the component replenishment target device disposed at the set position represented by the set position information J12. The warning time WT for each of the component replenishment target devices represented by the warning time information J43 is estimated by the component supply monitoring unit 341. The warning time WT changes according to the total number of remaining components represented by the total component remaining number information J16. For this reason, the warning time information J43 is updated in a predetermined cycle (for example, a cycle of 30 seconds) in response to the update of the total component remaining number information J16.

The stop time information J44 is information that represents the stop time ST until the total number of remaining components represented by the total component remaining number information J16 reaches the component remaining number stop value in the component replenishment target device disposed at the set position represented by the set position information J12. In the AF 241A, the tray feeder (TF) 245A, and the stick feeder (SF) 246A as the component replenishment target devices, for example, in a case where the component remaining number stop value is set to zero (0), the stop time information J44 is information representing time from the current time until the total number of remaining components represented by the total component remaining number information J16 reaches zero (0). In the splicing feeder as the component replenishment target device, for example, in a case where the component remaining number stop value is set to a predetermined value at which sending out of a tape for the splicing work is to be stopped, the stop time information J44 is information representing time from the current time until the total number of remaining components represented by the total component remaining number information J16 reaches the predetermined value. The stop time ST for each of the component replenishment target devices represented by the stop time information J44 is estimated by the component supply monitoring unit 341. The stop time ST changes according to the total number of remaining components represented by the total component remaining number information J16. For this reason, the stop time information J44 is updated in a predetermined cycle (for example, a cycle of 30 seconds) in response to the update of the total component remaining number information J16.

The producible time information J45 is information representing the producible time PT during which component supply according to the production of the component mounting substrate can be continued in the component replenishment target device disposed at the set position represented by the set position information J12. The producible time PT represented by the producible time information J45 indicates a time range in which component supply can be continued from the current time. Further, the producible time PT represented by the producible time information J45, which may be changed depending on the setting, is usually the same as the stop time ST represented by the stop time information J44. The producible time PT for each of the component replenishment target devices represented by the producible time information J45 is estimated by the component supply monitoring unit 341. The producible time PT changes according to the total number of remaining components represented by the total component remaining number information J16. For this reason, the producible time information J45 is updated in a predetermined cycle (for example, a cycle of 30 seconds) in response to the update of the total component remaining number information J16.

Each of the warning time information J43, the stop time information J44, and the producible time information J45 is also information that defines a component replenishment time limit that represents a time limit until the component replenishment work is required for the component replenishment target device. The component replenishment time limit is set for the component supply devices 241, 245, and 246. As the component replenishment time limit, the warning time WT until the total number of remaining components represented by the total component remaining number information J16 reaches the component remaining number warning value, the stop time ST until the total number of remaining components represented by the total component remaining number information J16 reaches the component remaining number stop value, the producible time PT until the component supply by the component replenishment target device becomes impossible, and the like can be used. That is, unless the component replenishment work is performed for the component replenishment target device before the component replenishment time limit is reached, the possibility of the component replenishment stoppage by the component replenishment target device increases, which affects the production of the component mounting substrate.

The work list information JH4 is stored in the memory unit 343 of the replenishment plan management device 30 and displayed on the display unit 33. Furthermore, the work list information JH4 is transmitted to the mounting control device 20 of each of the component mounters 2 and the mobile terminal device 30T carried by the operator OP via the communication unit 31. The memory unit 343 of the replenishment plan management device 30 stores the work list information JH4 updated in response to the replenishment target identification unit 3421 updating the identification result of the component replenishment target device in a predetermined cycle. When the work list information JH4 is input to the mounting control device 20 of each of the component mounters 2, the display unit 203 of the mounting control device 20 displays the work list information JH4. Further, when the work list information JH4 is input to the mobile terminal device 30T carried by the operator OP, the work list information JH4 is displayed on the mobile terminal device 30T.

The operator OP sequentially moves to the work target area represented by the work target area number information J41 in the work area TWA based on the work list information JH4 displayed on the mobile terminal device 30T and the like, and can perform the component replenishment work in each of the work target areas. When performing the component replenishment work in each of the work target areas, the operator OP can know the component replenishment target device disposed in the work target area based on the work list information JH4 displayed on the mobile terminal device 30T or the like.

<Regarding Operation of Work Determination Unit and Work Guidance Unit in Mounting Control Device>

As described above, the mounting control device 20 provided in each of the component mounters 2 constitutes part of the component replenishment management system 3. Details of the work determination unit 207 and the work guidance unit 208 included in the mounting control device 20 will be described below.

(Regarding Work Determination Unit)

As shown in FIG. 14, the operator OP makes the patrols in the work area TWA along the movement route 6R at regular time intervals (for example, 90 minutes) to perform the component replenishment work. A patrolling cycle PP representing regular time intervals at which the operator OP makes the patrols in the work area TWA to perform the component replenishment work is set in advance.

In the work target area represented by the work target area number information J41, when the operator OP performs reading operation for the component type identifying barcode attached to a new component storage member for replenishment using the barcode reader 7, replenishment component type information JH02 (FIG. 14) is input via the external input and output unit 204 to the mounting control device 20 of the component mounter 2 for which the work target area is set. At a timing at which the replenishment component type information JH02 is input, the work determination unit 207 extracts the set position information J12 associated with the component type information J14 representing the component of the same type as a component type of the replenishment component type information JH02 based on the work list information JH4. Then, the work determination unit 207 determines whether or not the component replenishment work can be performed for the component replenishment target device disposed at the set position represented by the extracted set position information J12.

In a case where replenishable detection information JH01 (FIG. 14) is output from the component replenishment target device at a timing at which the replenishment component type information JH02 is input, the work determination unit 207 determines that the component replenishment work can be performed for the component replenishment target device. The replenishable detection information JHO1 is information representing that the component replenishment target device can be replenished with a new component storage member for replenishment. For example, in a case where the component replenishment target device is the AF 241A, when all of the preceding component storage tape 243 is pulled out from the reel 2420, a rear end of the tape passes through a position of the second tape detection sensor 2416B, and detection of the preceding component storage tape 243 is finished, and sending out of the subsequent component storage tape 243 is automatically started, a front end of the tape passes through a position of the first tape detection sensor 2416A, the subsequent component storage tape 243 is detected, and detection information is output, the detection information becomes the replenishable detection information JHO1.

On the other hand, in a case where non-replenishable detection information JHO3 (FIG. 14) is output from the component replenishment target device at a timing at which the replenishment component type information JH02 is input, the work determination unit 207 determines that the component replenishment work cannot be performed for the component replenishment target device. The non-replenishable detection information JHO3 is information representing that the component replenishment target device cannot be replenished with a new component storage member for replenishment. For example, in a case where the component replenishment target device is the AF 241A, when the preceding component storage tape 243 is detected by the second tape detection sensor 2416B and detection information is output, and a front end of the subsequent component storage tape 243 is detected by the first tape detection sensor 2416A and detection information is output, the detection information becomes the non-replenishable detection information JHO3.

(Regarding Work Guidance Unit)

Figure 15:
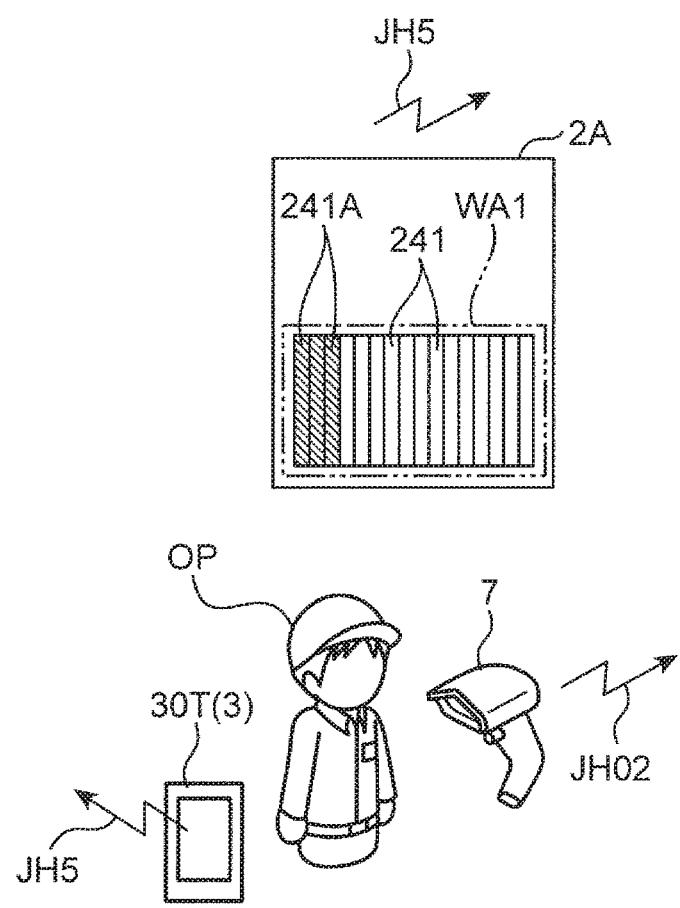
FIG. 15 is a diagram for describing work guidance processing executed by a work guidance unit of the mounting control device that constitutes the component replenishment management system.

FIG. 15 is a diagram for describing work guidance processing executed by the work guidance unit 208. The work guidance unit 208 executes the work guidance processing in a case where the work determination unit 207 determines that the component replenishment work cannot be performed. In this work guidance processing, the work guidance unit 208 generates, based on the work list information JH4, performing process guidance information JH5 that guides a performing process of the component replenishment work. Specifically, in a case where the work determination unit 207 determines that the component replenishment work cannot be performed at the timing at which the replenishment component type information JH02 is input, the work guidance unit 208 refers to the replenishable time TT represented by the replenishable time information J42 included in the work list information JH4 and generates the performing process guidance information JH5. A performing process of the component replenishment work represented by the performing process guidance information JH5 does not simply represent that "the component replenishment work cannot be performed", but represents that performance of the component replenishment work is waited until the replenishable time TT elapses, or represents that performance of the component replenishment work is postponed.

The performing process guidance information JH5 generated by the work guidance unit 208 is displayed on the display unit 203 of the mounting control device 20. Furthermore, the performing process guidance information JH5 is transmitted to the replenishment plan management device 30 and the mobile terminal device 30T carried by the operator OP via the communication unit 201. When the performing process guidance information JH5 is input to the replenishment plan management device 30, the performing process guidance information JH5 is displayed on the display unit 33 of the replenishment plan management device 30. Further, when the performing process guidance information JH5 is input to the mobile terminal device 30T carried by the operator OP, the performing process guidance information JH5 is displayed on the mobile terminal device 30T.

As described above, at a timing at which the operator OP performs the reading operation of the replenishment component type information JH02 in an attempt to perform the component replenishment work using the component storage member for replenishment, the work determination unit 207 determines whether or not the component replenishment work can be performed. At this timing, in a case where the component replenishment work is determined not to be able to be performed, the operator OP does not know what to do and may be confused.

In view of the above, in a case where the work determination unit 207 determines that the component replenishment work cannot be performed, the work guidance unit 208 generates the performing process guidance information JH5. The performing process guidance information JH5 is information for guiding a performing process of the component replenishment work based on the replenishable time TT represented by the replenishable time information J42 included in the work list information JH4. By referring to the performing process guidance information JH5 displayed on the mobile terminal device 30T or the like, the operator OP can know the performing process of the component replenishment work that is determined not to be able to be performed at the timing at which the reading operation of the replenishment component type information JH02 is performed. In this manner, it is possible to prevent confusion due to not knowing what to do, and improve the efficiency of the component replenishment work by the operator OP.

<Specific Example of Work Guidance Processing Executed by Work Guidance Unit>

Next, a specific example of the work guidance processing executed by the work guidance unit 208 when the performing process guidance information JH5 is generated will be described below.

(First Specific Example)

Figure 16:
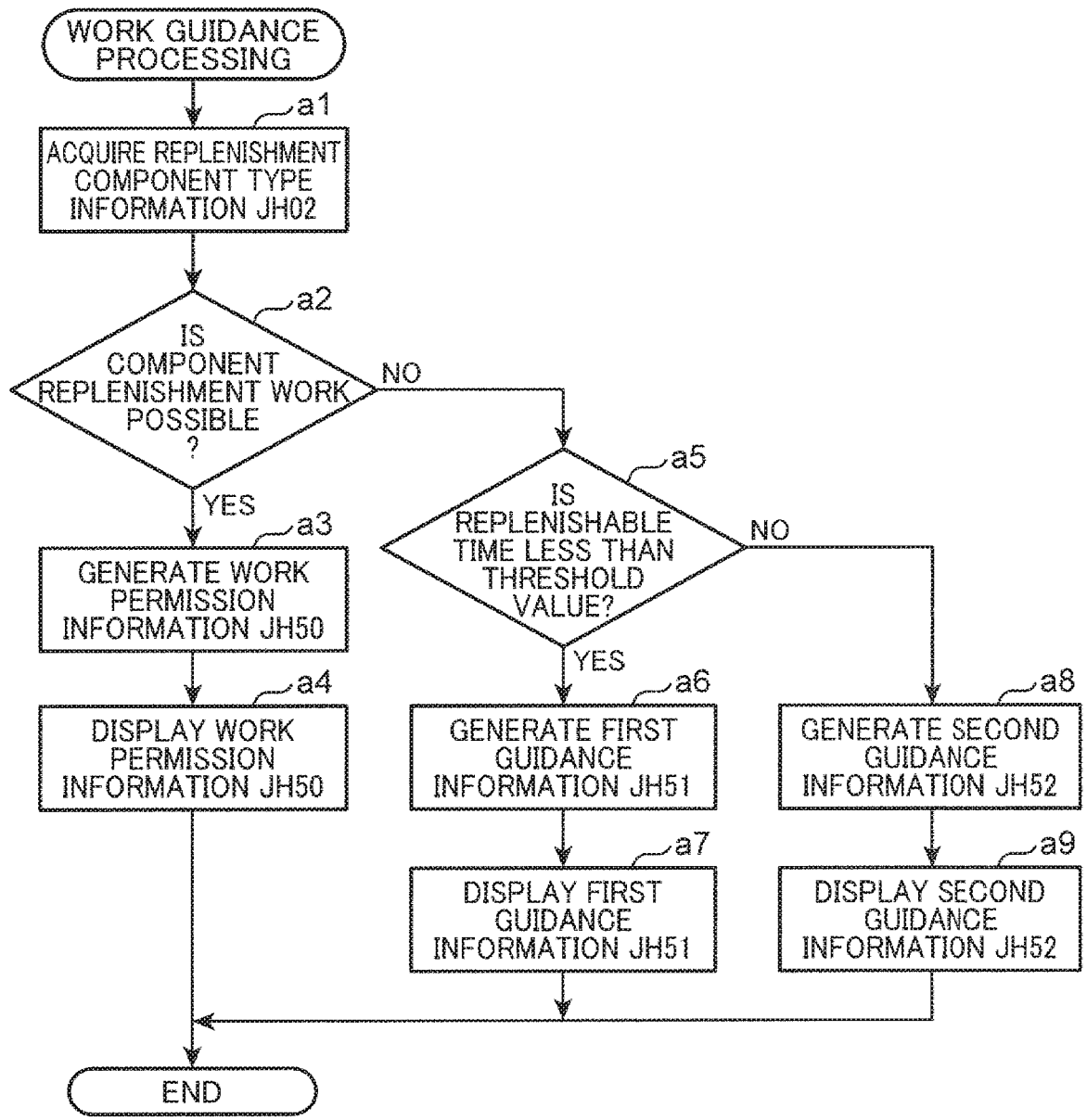
FIG. 16 is a flowchart showing a first specific example of the work guidance processing executed by the work guidance unit.

FIG. 16 is a flowchart showing a first specific example of the work guidance processing executed by the work guidance unit 208. The operator OP who makes the patrols in the work area TWA performs the reading operation of the replenishment component type information JH02 for a new component storage member for replenishment in the work target area represented by work target area number information J41 registered in the work list information JH4 displayed on the mobile terminal device 30T or the like. In this manner, the replenishment component type information JH02 is input via the external input and output unit 204 to the mounting control device 20 of the component mounter 2 in which the work target area is set (Step a1).

When the replenishment component type information JH02 is input, the work determination unit 207 extracts the set position information J12 associated with the component type information J14 representing the component of the same type as a component type of the replenishment component type information JH02 based on the work list information JH4 transmitted from the replenishment plan management device 30. The work determination unit 207 determines whether or not the component replenishment work can be performed for the component replenishment target device disposed at the set position represented by the extracted set position information J12 (Step a2).

In a case where the work determination unit 207 determines that the component replenishment work can be performed for the component replenishment target device, the work guidance unit 208 generates work permission information JH50 to permit the component replenishment work to be performed for the component replenishment target device (Step a3). The work permission information JH50 is, for example, message information indicating "The AF disposed at the set position S11 can be replenished with the component storage member for replenishment for which reading operation is performed.", and the like. The work permission information JH50 is displayed on the display unit 203 of the mounting control device 20, and also on the display unit 33 of the replenishment plan management device 30 and the mobile terminal device 30T (Step a4). By referring to the work permission information JH50 displayed on the mobile terminal device 30T or the like, the operator OP can know that the component replenishment work related to the component storage member for replenishment for which reading operation of the replenishment component type information JH02 is performed can be performed. The operator OP can perform the component replenishment work for the component replenishment target device according to the work permission information JH50.

On the other hand, in a case where the work determination unit 207 determines that the component replenishment work cannot be performed for the component replenishment target device, the work guidance unit 208 determines whether the replenishable time TT represented by the replenishable time information J42 included in the work list information JH4 is less than a predetermined threshold value or equal to or more than the threshold value (Step a5).

In a case where the replenishable time TT is less than the threshold value, the work guidance unit 208 generates first guidance information JH51 as the performing process guidance information JH5 (Step a6). The first guidance information JH51 is information that includes information related to the replenishable time TT and notifies that performance of the component replenishment work for the component replenishment target device is to be waited until the replenishable time TT elapses. In a case where the replenishable time TT is less than the threshold value, that is, in a case where time until the component replenishment work becomes possible is relatively short, the work guidance unit 208 generates the first guidance information JH51 as the performing process guidance information JH5. The first guidance information JH51 is information for guiding a performing process of waiting for performance of the component replenishment work until the replenishable time TT elapses. The first guidance information JH51 is, for example, message information indicating "The AF disposed at the set position S11 cannot be replenished with the component storage member for replenishment for which reading operation is performed. Time until performance of the component replenishment work becomes possible is TT. Please wait until the replenishable time TT elapses." and the like.

The first guidance information JH51 is displayed on the display unit 203 of the mounting control device 20, and also on the display unit 33 of the replenishment plan management device 30 and the mobile terminal device 30T (Step a7). By referring to the first guidance information JH51 displayed on the mobile terminal device 30T or the like, the operator OP recognizes the replenishable time TT until the component replenishment work becomes possible, and then can know that the operator OP should wait until the replenishable time TT elapses. The operator OP waits until the replenishable time TT elapses according to the first guidance information JH51, and then can perform the component replenishment work for the component replenishment target device.

In a case where the replenishable time TT is equal to or more than the threshold value, the work guidance unit 208 generates second guidance information JH52 as the performing process guidance information JH5 (Step a8). The second guidance information JH52 is information recommending that performance of the component replenishment work for the component replenishment target device be postponed. More specifically, the second guidance information JH52 is information that recommends that performance of the component replenishment work be postponed to when the operator OP makes the patrols in the work area TWA next time. In a case where the replenishable time TT is equal to or more than the threshold value, that is, in a case where time until the component replenishment work becomes possible is relatively long, the work guidance unit 208 generates the second guidance information JH52 as the performing process guidance information JH5. The second guidance information JH52 is information that guides a processing process of postponing performance of the component replenishment work to when the operator OP makes the patrols in the work area TWA next time. The second guidance information JH52 is, for example, message information indicating "The AF disposed at the set position S11 cannot be replenished with the component storage member for replenishment for which reading operation is performed. Please postpone the component replenishment work for this AF to the next patrol, and proceed to the component replenishment work for the next component replenishment target device in this patrol." and the like.

The second guidance information JH52 is displayed on the display unit 203 of the mounting control device 20, and also on the display unit 33 of the replenishment plan management device 30 and the mobile terminal device 30T (Step a9). By referring to the second guidance information JH52 displayed on the mobile terminal device 30T or the like, the operator OP can know that the operator OP should postpone the component replenishment work to the next patrol after certain time represented by the patrolling cycle PP without waiting for the replenishable time TT to elapse in this patrol. The operator OP can perform the component replenishment work for the next component replenishment target device in this patrol, and can perform the component replenishment work for the postponed component replenishment target device in the next patrol.

(Second Specific Example)

Figure 17:
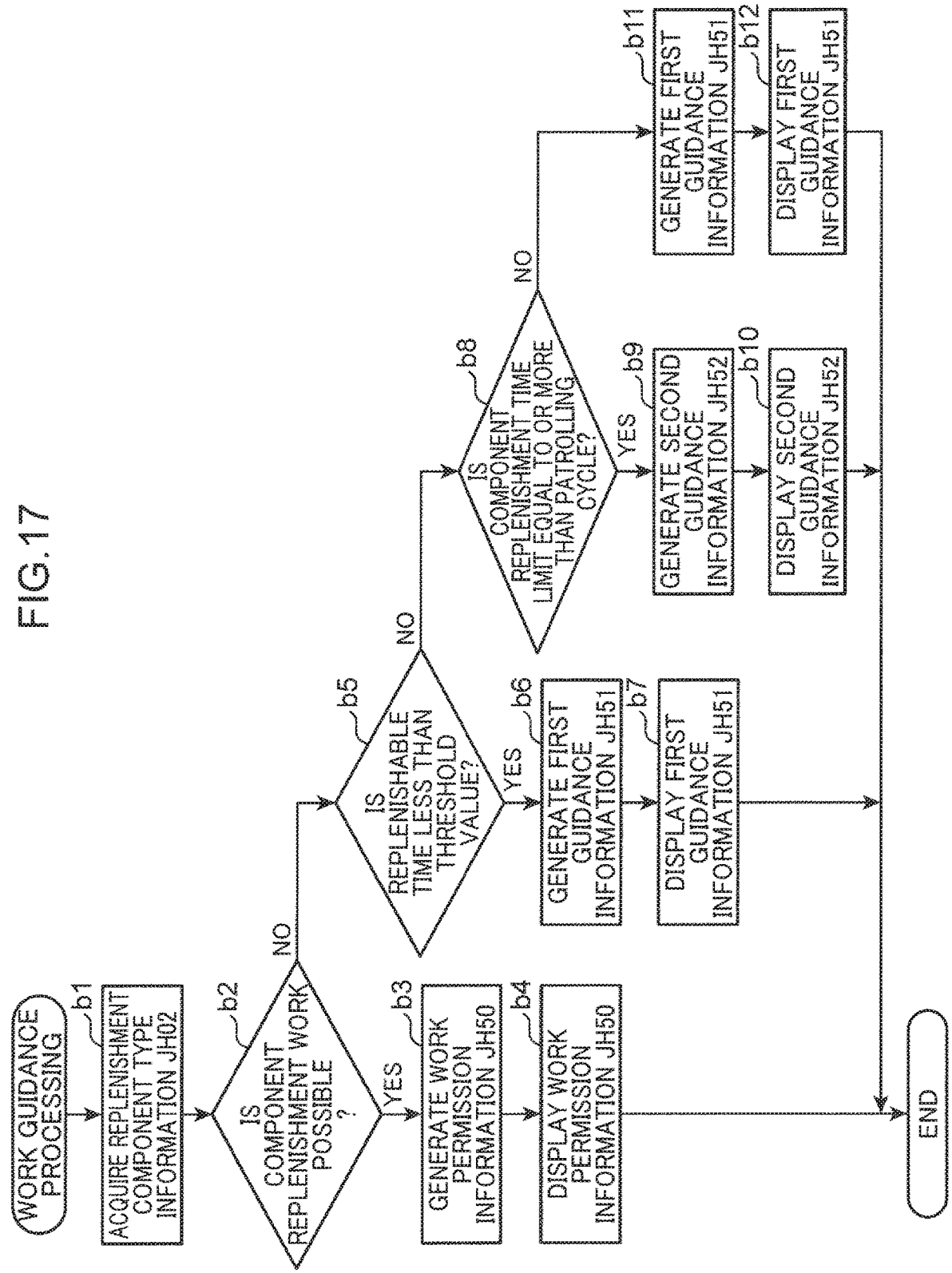
FIG. 17 is a flowchart showing a second specific example of the work guidance processing executed by the work guidance unit.

FIG. 17 is a flowchart showing a second specific example of the work guidance processing executed by the work guidance unit 208. In the work target area represented by the work target area number information J41 of the work list information JH4, when the operator OP performs reading operation for the replenishment component type information JH02, the replenishment component type information JH02 is input via the external input and output unit 204 to the mounting control device 20 of the component mounter 2 for which the work target area is set (Step b1).

When the replenishment component type information JH02 is input, the work determination unit 207 extracts the set position information J12 associated with the component type information J14 representing the component of the same type as a component type of the replenishment component type information JH02 based on the work list information JH4 transmitted from the replenishment plan management device 30. The work determination unit 207 determines whether or not the component replenishment work can be performed for the component replenishment target device disposed at the set position represented by the extracted set position information J12 (Step b2).

In a case where the work determination unit 207 determines that the component replenishment work can be performed for the component replenishment target device, the work guidance unit 208 generates the work permission information JH50 to permit the component replenishment work to be performed for the component replenishment target device (Step b3). The work permission information JH50 is displayed on the display unit 203 of the mounting control device 20, and also on the display unit 33 of the replenishment plan management device 30 and the mobile terminal device 30T (Step b4). By referring to the work permission information JH50 displayed on the mobile terminal device 30T or the like, the operator OP can know that the component replenishment work related to the component storage member for replenishment for which reading operation of the replenishment component type information JH02 is performed can be performed.

On the other hand, in a case where the work determination unit 207 determines that the component replenishment work cannot be performed for the component replenishment target device, the work guidance unit 208 determines whether the replenishable time TT represented by the replenishable time information J42 included in the work list information JH4 is less than a predetermined threshold value or equal to or more than the threshold value (Step b5).

In a case where the replenishable time TT is less than the threshold value, the work guidance unit 208 generates the first guidance information JH51 as the performing process guidance information JH5 (Step b6). The first guidance information JH51 is information that includes information related to the replenishable time TT and notifies that performance of the component replenishment work for the component replenishment target device is to be waited until the replenishable time TT elapses. The first guidance information JH51 is displayed on the display unit 203 of the mounting control device 20, and also on the display unit 33 of the replenishment plan management device 30 and the mobile terminal device 30T (Step b7). By referring to the first guidance information JH51 displayed on the mobile terminal device 30T or the like, the operator OP recognizes the replenishable time TT until the component replenishment work becomes possible, and then can know that the operator OP should wait until the replenishable time TT elapses.

When the replenishable time TT is equal to or more than the threshold value, the work guidance unit 208 refers to the warning time information J43, the stop time information J44, and the producible time information J45 included in the work list information JH4. As described above, the warning time WT represented by the warning time information J43, the stop time ST represented by the stop time information J44, and the producible time PT represented by the producible time information J45 define the component replenishment time limit until performance of the component replenishment work becomes necessary. In a case where the replenishable time TT is equal to or more than the threshold value, the work guidance unit 208 determines whether the component replenishment time limit is equal to or more than the patrolling cycle PP or less than the patrolling cycle PP (Step b8).

In a case where the component replenishment time limit is equal to or more than the patrolling cycle PP in the work area TWA by the operator OP, the component replenishment work can be performed within the component replenishment time limit even when the operator OP makes the patrols in the work area TWA next time. In view of the above, in a case where the replenishable time TT is equal to or more than the threshold value and the component replenishment time limit is equal to or more than the patrolling cycle PP, the work guidance unit 208 generates the second guidance information JH52 as the performing process guidance information JH5 (Step b9). The second guidance information JH52 is information that guides a processing process of postponing performance of the component replenishment work to when the operator OP makes the patrols in the work area TWA next time.

The second guidance information JH52 is displayed on the display unit 203 of the mounting control device 20, and also on the display unit 33 of the replenishment plan management device 30 and the mobile terminal device 30T (Step b10). By referring to the second guidance information JH52 displayed on the mobile terminal device 30T or the like, the operator OP can perform the component replenishment work within the component replenishment time limit in the next patrol without waiting for the replenishable time TT to elapse in this patrol.

In a case where the component replenishment time limit is less than the patrolling cycle PP in the work area TWA by the operator OP, the component replenishment work cannot be performed within the component replenishment time limit when the operator OP makes the patrols in the work area TWA next time. In view of the above, in a case where the replenishable time TT is equal to or more than the threshold value and the component replenishment time limit is less than the patrolling cycle PP, the work guidance unit 208 generates the first guidance information JH51 as the performing process guidance information JH5 (Step b11). The first guidance information JH51 is information that includes information related to the replenishable time TT and notifies that performance of the component replenishment work for the component replenishment target device is to be waited until the replenishable time TT elapses.

The first guidance information JH51 is displayed on the display unit 203 of the mounting control device 20, and also on the display unit 33 of the replenishment plan management device 30 and the mobile terminal device 30T (Step b12). By referring to the first guidance information JH51 displayed on the mobile terminal device 30T or the like, the operator OP recognizes the replenishable time TT until the component replenishment work becomes possible, and then can know that the operator OP should wait until the replenishable time TT elapses. The operator OP can perform the component replenishment work within the component replenishment time limit in this patrol, although the waiting time until the component replenishment work becomes possible is somewhat longer.

(Third Specific Example)

Figure 18A:
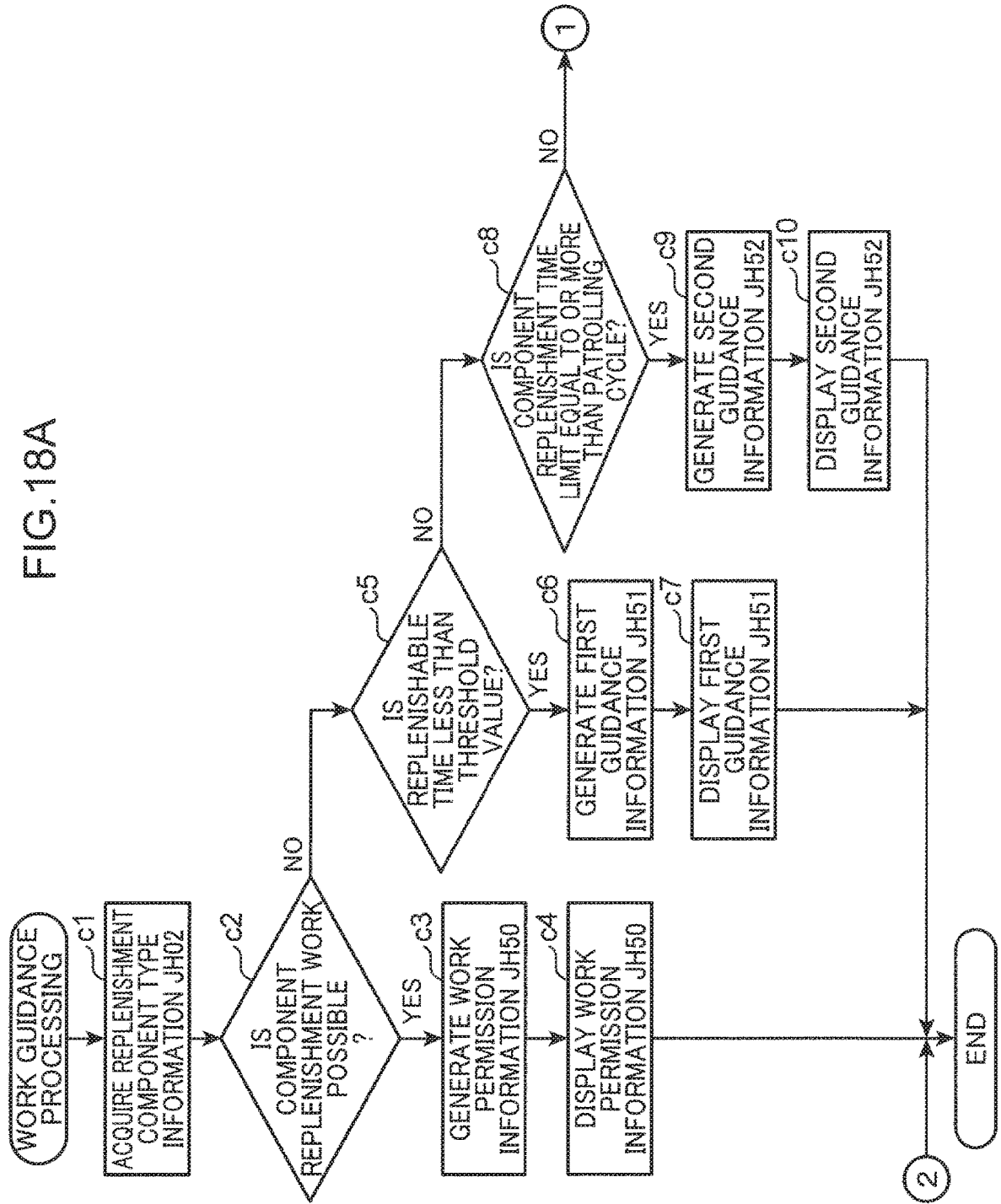
FIG. 18A is a flowchart showing a third specific example of the work guidance processing executed by the work guidance unit.
Figure 18B:
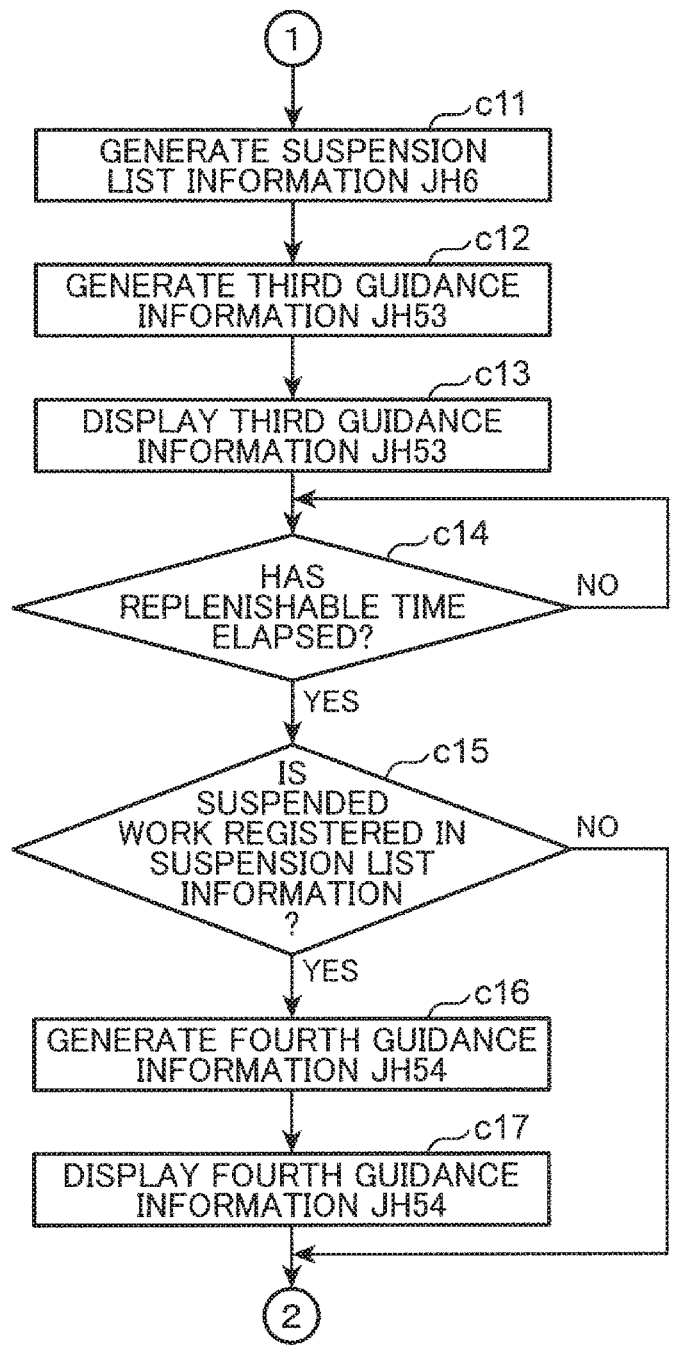
FIG. 18B is a flowchart showing the third specific example of the work guidance processing executed by the work guidance unit.

FIGS. 18A and 18B are a flowchart showing a third specific example of the work guidance processing executed by the work guidance unit 208. In the work target area represented by the work target area number information J41 of the work list information JH4, when the operator OP performs reading operation for the replenishment component type information JH02, the replenishment component type information JH02 is input via the external input and output unit 204 to the mounting control device 20 of the component mounter 2 for which the work target area is set (Step c1).

When the replenishment component type information JH02 is input, the work determination unit 207 extracts the set position information J12 associated with the component type information J14 representing the component of the same type as a component type of the replenishment component type information JH02 based on the work list information JH4 transmitted from the replenishment plan management device 30. The work determination unit 207 determines whether or not the component replenishment work can be performed for the component replenishment target device disposed at the set position represented by the extracted set position information J12 (Step c2).

In a case where the work determination unit 207 determines that the component replenishment work can be performed for the component replenishment target device, the work guidance unit 208 generates the work permission information JH50 to permit the component replenishment work to be performed for the component replenishment target device (Step c3). The work permission information JH50 is displayed on the display unit 203 of the mounting control device 20, and also on the display unit 33 of the replenishment plan management device 30 and the mobile terminal device 30T (Step c4). By referring to the work permission information JH50 displayed on the mobile terminal device 30T or the like, the operator OP can know that the component replenishment work related to the component storage member for replenishment for which reading operation of the replenishment component type information JH02 is performed can be performed.

On the other hand, in a case where the work determination unit 207 determines that the component replenishment work cannot be performed for the component replenishment target device, the work guidance unit 208 determines whether the replenishable time TT represented by the replenishable time information J42 included in the work list information JH4 is less than a predetermined threshold value or equal to or more than the threshold value (Step c5).

In a case where the replenishable time TT is less than the threshold value, the work guidance unit 208 generates the first guidance information JH51 as the performing process guidance information JH5 (Step c6). The first guidance information JH51 is information that includes information related to the replenishable time TT and notifies that performance of the component replenishment work for the component replenishment target device is to be waited until the replenishable time TT elapses. The first guidance information JH51 is displayed on the display unit 203 of the mounting control device 20, and also on the display unit 33 of the replenishment plan management device 30 and the mobile terminal device 30T (Step c7). By referring to the first guidance information JH51 displayed on the mobile terminal device 30T or the like, the operator OP recognizes the replenishable time TT until the component replenishment work becomes possible, and then can know that the operator OP should wait until the replenishable time TT elapses.

When the replenishable time TT is equal to or more than the threshold value, the work guidance unit 208 refers to the component replenishment time limit represented by the warning time information J43, the stop time information J44, and the producible time information J45 included in the work list information JH4. In a case where the replenishable time TT is equal to or more than the threshold value, the work guidance unit 208 determines whether the component replenishment time limit is equal to or more than the patrolling cycle PP or less than the patrolling cycle PP (Step c8).

In a case where the replenishable time TT is equal to or more than the threshold value and the component replenishment time limit is equal to or more than the patrolling cycle PP, the work guidance unit 208 generates the second guidance information JH52 as the performing process guidance information JH5 (Step c9). The second guidance information JH52 is information that guides a processing process of postponing performance of the component replenishment work to when the operator OP makes the patrols in the work area TWA next time. The second guidance information JH52 is displayed on the display unit 203 of the mounting control device 20, and also on the display unit 33 of the replenishment plan management device 30 and the mobile terminal device 30T (Step c10). By referring to the second guidance information JH52 displayed on the mobile terminal device 30T or the like, the operator OP can perform the component replenishment work within the component replenishment time limit in the next patrol without waiting for the replenishable time TT to elapse in this patrol.

In a case where the replenishable time TT is equal to or more than the threshold value and the component replenishment time limit is less than the patrolling cycle PP, the work guidance unit 208 generates suspension list information JH6 shown in FIG. 19A (Step c11). The suspension list information JH6 is information that lists the component replenishment target devices for which performance of the component replenishment work should temporarily be suspended. The suspension list information JH6 is information in which the work target area number information J41, the mounter type information J11, the set position information J12, the device type information J13, the component type information J14, and flag information J61 are associated with each other. The flag information J61 is a flag that guides a performing process of the component replenishment work for the component replenishment target device disposed at the set position represented by the set position information J12 in the work target area represented by the work target area number information J41. In a case where the component replenishment time limit is less than the patrolling cycle PP, the work guidance unit 208 generates the suspension list information JH6 to which a "suspension" flag, indicating that performance of the component replenishment work is temporarily suspended, is added as the flag information J61.

Upon generating the suspension list information JH6, the work guidance unit 208 generates third guidance information JH53 as the performing process guidance information JH5 based on the suspension list information JH6 (Step c12). The third guidance information JH53 is information that recommends performance of the component replenishment work for the next component replenishment target device by temporarily suspending performance of the component replenishment work for the component replenishment target device disposed at the set position represented by the set position information J12 of the suspension list information JH6. The third guidance information JH53 is, for example, message information indicating "The AF disposed at the set position S13 cannot be replenished with the component storage member for replenishment for which reading operation is performed. Please temporarily suspend the component replenishment work for this AF, and proceed to the component replenishment work for the next component replenishment target device." and the like. The third guidance information JH53 is displayed on the display unit 203 of the mounting control device 20, and also on the display unit 33 of the replenishment plan management device 30 and the mobile terminal device 30T (Step c13). By referring to the third guidance information JH53 displayed on the mobile terminal device 30T or the like, the operator OP temporarily suspends performance of the component replenishment work corresponding to the third guidance information JH53, and can perform, for example, another component replenishment work.

Next, the work guidance unit 208 determines whether or not the replenishable time TT represented by the replenishable time information J42 included in the work list information JH4 has elapsed (Step c14). In a case where the replenishable time TT has elapsed, the work guidance unit 208 determines whether or not the component replenishment work (suspended work) whose work is temporarily suspended is registered in the suspension list information JH6 (Step c15). In a case where the "suspension" flag is added to the flag information J61 of the suspension list information JH6, the work guidance unit 208 determines that the suspended work is registered in the suspension list information JH6. In a case where no suspended work is registered in the suspension list information JH6, the work guidance unit 208 finishes the work guidance processing.

On the other hand, in a case where the suspended work is registered in the suspension list information JH6, the work guidance unit 208 changes the flag information J61 of the suspension list information JH6 from the "suspension" flag to a "workable" flag after the replenishable time TT elapses (see FIG. 19B). The "workable" flag indicates that the component replenishment work can be performed due to elapse of the replenishable time TT. Then, the work guidance unit 208 generates fourth guidance information JH54 as the performing process guidance information JH5 (Step c16). The fourth guidance information JH54 is information for requesting the work to be performed after the replenishable time TT elapses for the component replenishment work that is temporarily suspended. The fourth guidance information JH54 is, for example, message information indicating "Please perform the component replenishment work for the AF disposed at the set position S13 of a component mounter Ml, the component replenishment work being temporarily suspended." and the like.

The fourth guidance information JH54 is displayed on the display unit 203 of the mounting control device 20, and also on the display unit 33 of the replenishment plan management device 30 and the mobile terminal device 30T (Step c17). By referring to the fourth guidance information JH54 displayed on the mobile terminal device 30T or the like, the operator OP can know that the component replenishment work that is temporarily suspended can be performed, and perform the component replenishment work within the component replenishment time limit in this patrol.

Note that the specific embodiments described above mainly include embodiments having a configuration below.

A component replenishment management system according to one aspect of the present disclosure is a system that manages, in one or a plurality of component mounting lines in which a plurality of component mounters are connected, the component mounters being for mounting a component supplied from a plurality of component supply devices capable of mounting a plurality of component storage members on a substrate to produce a component mounting substrate, component replenishment work for each of the plurality of component supply devices. The component replenishment work is performed by an operator who makes the patrols in a work area set to the component mounting lines. The component replenishment management system includes a component supply monitoring unit configured to monitor a supply state of a component in each of the plurality of component supply devices, and estimates, for each of the plurality of component supply devices, replenishable time representing time until a preceding component storage member from which component supply is performed first among the plurality of component storage members runs out of a component and the component replenishment work for replenishing with a new component storage member for replenishment becomes possible. The component management system further includes an information acquisition unit configured to acquire replenishment component type information for identifying a component type of a component stored in the component storage member for replenishment, a determination unit configured to determine whether or not the component replenishment work for replenishing the component supply device with the component storage member for replenishment is allowed to be performed at a timing at which the replenishment component type information is acquired by the information acquisition unit, and a work guidance unit configured to generate performing process guidance information guiding a performing process based on the replenishable time of the component replenishment work in a case where the determination unit determines that the component replenishment work is not allowed to be performed.

According to the component replenishment management system, the component supply monitoring unit monitors a supply state of the component in the component supply device attached to each of the component mounters in the component mounting line. The component supply monitoring unit estimates, for each component supply device, replenishable time that represents time until the component replenishment work by the operator becomes possible. The operator can perform the component replenishment work for the component supply device by using the replenishable time estimated by the component supply monitoring unit as a guide. Here, the determination unit determines whether or not the component replenishment work can be actually performed. A timing at which the determination unit determines whether or not the component replenishment work can be performed is a timing at which the replenishment component type information is acquired by the information acquisition unit. This replenishment component type information is information for identifying a component type of the component stored in the component storage member for replenishment, and is read from the component storage member for replenishment by the operation of the operator during the component replenishment work. That is, at a timing at which the operator performs the reading operation of the replenishment component type information in an attempt to perform the component replenishment work using the component storage member for replenishment, the determination unit determines whether or not the component replenishment work can be performed. At this timing, in a case where the component replenishment work is determined not to be able to be performed, the operator does not know what to do and may be confused.

In view of the above, in a case where the determination unit determines that the component replenishment work cannot be performed, the work guidance unit generates the performing process guidance information. The performing process guidance information is information for guiding the performing process based on the replenishable time of the component replenishment work. By referring to the performing process guidance information, the operator can know the performing process of the component replenishment work that is determined not to be able to be performed at the timing at which the reading operation of the replenishment component type information is performed. In this manner, it is possible to prevent confusion due to not knowing what to do, and improve the efficiency of the component replenishment work by the operator.

In the above component replenishment management system, the patrolling cycle representing regular time intervals at which the operator makes the patrols in the work area to perform the component replenishment work is set in advance. Then, the work guidance unit may be configured to determine whether the replenishable time is less than a predetermined threshold value or equal to or more than the threshold value, and generate, as the performing process guidance information, the first guidance information for notifying that performance of the component replenishment work is waited until the replenishable time elapses in a case where the replenishable time is less than the threshold value, and generate, as the performing process guidance information, the second guidance information recommending to postpone performance of the component replenishment work to the next patrol in the work area by the operator in a case where the replenishable time is equal to or more than the threshold value.

In this aspect, in a case where the replenishable time is less than the threshold value, that is, in a case where time until the component replenishment work becomes possible is relatively short, the work guidance unit generates the first guidance information as the performing process guidance information. The first guidance information is information for guiding a performing process of waiting for performance of the component replenishment work until the replenishable time elapses. By referring to the first guidance information, the operator recognizes the replenishable time until the component replenishment work becomes possible, and then can know that the operator should wait until the replenishable time elapses.

On the other hand, in a case where the replenishable time is equal to or more than the threshold value, that is, in a case where time until the component replenishment work becomes possible is relatively long, the work guidance unit generates the second guidance information as the performing process guidance information. The second guidance information is information that guides a processing process of postponing performance of the component replenishment work to when the operator makes the patrols in the work area next time. By referring to the second guidance information, the operator can know that the component replenishment work is preferably postponed to the next patrol without waiting until the replenishable time elapses.

In the above component replenishment management system, the component supply monitoring unit is configured to estimate, for each of the plurality of component supply devices, the component replenishment time limit that is longer than the replenishable time and is until performance of the component replenishment work becomes necessary. The work guidance unit may be configured to generate the second guidance information in a case where the component replenishment time limit is equal to or more than the patrolling cycle when determining that the replenishable time is equal to or more than the threshold value.

In order to prevent the supply of the component from the component supply device from being stopped, the component replenishment work for replenishing the component supply device with the component storage member for replenishment needs to be performed before all the components of each of the component storage members mounted on the component supply device run out. In a case where the component replenishment time limit until performance of the component replenishment work becomes necessary is equal to or more than the patrolling cycle in the work area by the operator, the component replenishment work can be performed within the component replenishment time limit even when the operator makes the patrols in the work area next time. In view of the above, in a case where the replenishable time is equal to or more than the threshold value and time until the component replenishment work becomes possible is relatively long, and the component replenishment time limit is equal to or more than the patrolling cycle, the work guidance unit generates the second guidance information that recommends to postpone performance of the component replenishment work to the next patrol. By referring to the second guidance information, the operator can perform the component replenishment work within the component replenishment time limit in the next patrol without waiting for the replenishable time to elapse in this patrol.

In the above component replenishment management system, the work guidance unit may be configured to generate the first guidance information in a case where the component replenishment time limit is less than the patrolling cycle when determining that the replenishable time is equal to or more than the threshold value.

In a case where the component replenishment time limit is less than the patrolling cycle, the component replenishment work cannot be performed within the component replenishment time limit when the operator makes the patrols in the work area next time. In view of the above, in a case where the component replenishment time limit is less than the patrolling cycle, the work guidance unit generates the first guidance information for notifying to wait until the replenishable time elapses. By referring to the first guidance information, the operator can perform the component replenishment work within the component replenishment time limit in this patrol, although the waiting time until the component replenishment work becomes possible is somewhat longer.

In the component replenishment management system, the work guidance unit may be configured to generate, as the performing process guidance information, third guidance information notifying temporary suspension of performance of the component replenishment work in a case where the component replenishment time limit is less than the patrolling cycle when determining that the replenishable time is equal to or more than the threshold value, and fourth guidance information requesting performance of the component replenishment work that is temporarily suspended after the replenishable time elapses.

In this aspect, in a case where the replenishable time is equal to or more than the threshold value and the component replenishment time limit is less than the patrolling cycle, the work guidance unit generates the third guidance information notifying temporary suspension of performance of the component replenishment work, and the fourth guidance information requesting performance of the component replenishment work after the replenishable time elapses. By referring to the third guidance information, the operator temporarily suspends performance of the component replenishment work corresponding to the third guidance information, and can perform, for example, another component replenishment work. Then, by referring to the fourth guidance information, the operator can know that the component replenishment work that is temporarily suspended can be performed, and perform the component replenishment work within the component replenishment time limit in this patrol.

A component mounting system according to another aspect of the present disclosure includes one or a plurality of component mounting lines in which a plurality of component mounters are connected, the component mounters being for mounting a component supplied from a plurality of component supply devices capable of mounting a plurality of component storage members on a substrate to produce a component mounting substrate, and the component replenishment management system that manages component replenishment work for each of the plurality of component supply devices. The component replenishment work is performed by an operator who makes the patrols in a work area set to the component mounting lines.

According to this component mounting system, the component replenishment management system capable of improving the efficiency of the component replenishment work for the component supply device is included. Accordingly, stoppage of the supply of the component from the component supply device due to delay in the component replenishment work by the operator during the production of the component mounting substrate is suppressed as much as possible. In this manner, lowering in the production efficiency of the component mounting substrate can be suppressed.

As described above, according to the present disclosure, the component replenishment management system capable of improving the efficiency of the component replenishment work for a component supply device attached to each component mounter in the component mounting line, and the component mounting system including the component replenishment management system can be provided.

What is claimed is:

1. A component replenishment management system that manages, in one or a plurality of component mounting lines in which a plurality of component mounters are connected, the component mounters being for mounting a component supplied from a plurality of component supply devices capable of mounting a plurality of component storage members on a substrate to produce a component mounting substrate, component replenishment work for each of the plurality of component supply devices, the component replenishment work being performed by an operator who makes patrols in a work area set to each of the component mounting lines, the component replenishment management system comprising:
   a component supply monitoring unit configured to monitor a supply state of a component in each of the plurality of component supply devices, and estimate, for each of the plurality of component supply devices, replenishable time representing time until a preceding component storage member from which component supply is performed first among the plurality of component storage members runs out of a component and the component replenishment work for replenishing with a new component storage member for replenishment becomes possible;
   an information acquisition unit configured to acquire replenishment component type information for identifying a component type of a component stored in the new component storage member for replenishment;
   a determination unit configured to determine whether or not the component replenishment work for replenishing the component supply device with the new component storage member for replenishment is allowed to be performed at a timing at which the replenishment component type information is acquired by the information acquisition unit; and
   a work guidance unit configured to generate performing process guidance information guiding a performing process based on the replenishable time of the component replenishment work in a case where the determination unit determines that the component replenishment work is not allowed to be performed.

2. The component replenishment management system according to claim 1, wherein
   a patrolling cycle representing regular time intervals at which the operator makes patrols in the work area to perform the component replenishment work is set in advance, and
   the work guidance unit is configured to
      determine whether the replenishable time is less than a predetermined threshold value or equal to or more than the threshold value,
      generate, as the performing process guidance information, first guidance information for notifying that performance of the component replenishment work is delayed until the replenishable time elapses in a case where the replenishable time is less than the threshold value, and
      generate, as the performing process guidance information, second guidance information recommending to postpone performance of the component replenishment work to a next patrol in the work area by the operator in a case where the replenishable time is equal to or more than the threshold value.

3. The component replenishment management system according to claim 2, wherein
   the component supply monitoring unit is configured to estimate, for each of the plurality of component supply devices, a component replenishment time limit that is longer than the replenishable time and is until performance of the component replenishment work becomes necessary, and
   the work guidance unit is configured to generate the second guidance information in a case where the component replenishment time limit is equal to or more than the patrolling cycle when determining that the replenishable time is equal to or more than the threshold value.

4. The component replenishment management system according to claim 3, wherein
   the work guidance unit is configured to generate the first guidance information in a case where the component replenishment time limit is less than the patrolling cycle when determining that the replenishable time is equal to or more than the threshold value.

5. A component mounting system, comprising:
   one or a plurality of component mounting lines in which a plurality of component mounters are connected, the component mounters being for mounting a component supplied from a plurality of component supply devices capable of mounting a plurality of component storage members on a substrate to produce a component mounting substrate; and
   the component replenishment management system according to claim 4 that manages component replenishment work for each of the plurality of component supply devices, the component replenishment work being performed by an operator who makes patrols in a work area set to each of the component mounting lines.

6. The component replenishment management system according to claim 3, wherein
   the work guidance unit is configured to generate, as the performing process guidance information, third guidance information notifying temporary suspension of performance of the component replenishment work in a case where the component replenishment time limit is less than the patrolling cycle when determining that the replenishable time is equal to or more than the threshold value, and fourth guidance information requesting performance of the component replenishment work that is temporarily suspended after the replenishable time elapses.

7. A component mounting system, comprising:
   one or a plurality of component mounting lines in which a plurality of component mounters are connected, the component mounters being for mounting a component supplied from a plurality of component supply devices capable of mounting a plurality of component storage members on a substrate to produce a component mounting substrate; and
   the component replenishment management system according to claim 5 that manages component replenishment work for each of the plurality of component supply devices, the component replenishment work being performed by an operator who makes patrols in a work area set to each of the component mounting lines.

8. A component mounting system, comprising:

one or a plurality of component mounting lines in which a plurality of component mounters are connected, the component mounters being for mounting a component supplied from a plurality of component supply devices capable of mounting a plurality of component storage members on a substrate to produce a component mounting substrate; and the component replenishment management system according to claim 3 that manages component replenishment work for each of the plurality of component supply devices, the component replenishment work being performed by an operator who makes patrols in a work area set to each of the component mounting lines.

9. A component mounting system, comprising:

one or a plurality of component mounting lines in which a plurality of component mounters are connected, the component mounters being for mounting a component supplied from a plurality of component supply devices capable of mounting a plurality of component storage members on a substrate to produce a component mounting substrate; and the component replenishment management system according to claim 2 that manages component replenishment work for each of the plurality of component supply devices, the component replenishment work being performed by an operator who makes patrols in a work area set to each of the component mounting lines.

10. A component mounting system, comprising:

one or a plurality of component mounting lines in which a plurality of component mounters are connected, the component mounters being for mounting a component supplied from a plurality of component supply devices capable of mounting a plurality of component storage members on a substrate to produce a component mounting substrate; and the component replenishment management system according to claim 1 that manages component replenishment work for each of the plurality of component supply devices, the component replenishment work being performed by an operator who makes patrols in a work area set to each of the component mounting lines.

* * * * *